(12) United States Patent
Hwang et al.

(10) Patent No.: US 9,142,721 B2
(45) Date of Patent: Sep. 22, 2015

(54) SEMICONDUCTOR LIGHT EMITTING DEVICE AND MANUFACTURING METHOD OF THE SAME

(71) Applicant: SAMSUNG ELECTRONICS CO., LTD., Suwon-si, Gyeonggi-do (KR)

(72) Inventors: Kyung Wook Hwang, Hwaseong-si (KR); Han Kyu Seong, Seoul (KR); Nam Goo Cha, Ansan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/152,465

(22) Filed: Jan. 10, 2014

(65) Prior Publication Data

US 2014/0203240 A1   Jul. 24, 2014

(30) Foreign Application Priority Data

Jan. 18, 2013  (KR) .................. 10-2013-0005769

(51) Int. Cl.
*H01L 33/50* (2010.01)
*H01L 33/24* (2010.01)
*H01L 33/08* (2010.01)
*H01L 33/00* (2010.01)

(52) U.S. Cl.
CPC ............... *H01L 33/24* (2013.01); *H01L 33/08* (2013.01); *H01L 33/005* (2013.01)

(58) Field of Classification Search
CPC ......... H01L 33/08; H01L 33/24; H01L 33/06; H01L 33/14; H01L 33/20
USPC .................. 257/13, 89, 98, 79, 103
See application file for complete search history.

(56) References Cited

U.S. PATENT DOCUMENTS

2011/0291072 A1* 12/2011 Kim .............................. 257/13

FOREIGN PATENT DOCUMENTS

KR   10-2011-0131801 A   12/2011
KR   10-2011-0132162 A   12/2011

* cited by examiner

*Primary Examiner* — Cathy N Lam
(74) *Attorney, Agent, or Firm* — McDermott Will & Emery LLP

(57) ABSTRACT

A semiconductor light emitting device includes a substrate; a base layer made of a first conductivity-type semiconductor and disposed on the substrate; a plurality of nanoscale light emitting units disposed in a region of an upper surface of the base layer and including a first conductivity-type nano-semiconductor layer protruding from the upper surface of the base layer, a nano-active layer disposed on the first conductivity-type nano-semiconductor layer, and a second conductivity-type nano-semiconductor layer disposed on the nano-active layer; and a light emitting laminate disposed in a different region of the upper surface of the base layer and having a laminated active layer.

9 Claims, 24 Drawing Sheets

SEMICONDUCTOR LIGHT EMITTING DEVICE AND MANUFACTURING METHOD OF THE SAME

CROSS-REFERENCE TO RELATED APPLICATIONS

This application claims the priority of Korean Patent Application No. 10-2013-0005769 filed on Jan. 18, 2013, in the Korean Intellectual Property Office, the disclosure of which is incorporated herein by reference.

TECHNICAL FIELD

The present inventive concept relates to a semiconductor light emitting device and a manufacturing method of the same.

BACKGROUND

Light emitting diodes (LED) have a relatively long lifespan, consume relatively small amounts of power, have a fast response speed, and are environmentally friendly. As a result, they are known as next-generation light sources, and have come to prominence as important light sources in various products such as lighting devices, backlights in display devices, and the like.

In particular, demand for white light emitting diodes is on the rise. In order to provide white light, phosphors may be used with LEDs. For example, in a light emitting device that emits UV light, red, green, and blue phosphors may be used. The phosphors are excited by the UV light to emit red light, green light, and blue light, respectively, to obtain white light. Alternatively, a blue light emitting device may be used to excite a yellow phosphor (a color complementary to blue) to emit yellow light, and to thereby obtain white light. In addition, without phosphors, white color may be obtained by combining separate light emitting devices that emit red, green, and blue visible light, respectively.

In this manner, a desired color of light may be obtained by combining light having various wavelengths generated by a light emitting device, and thus, a method for implementing various colors, other than white, is required.

SUMMARY

An aspect of the present inventive concepts provides a semiconductor light emitting device capable of implementing light having multiple wavelengths without using a phosphor and having enhanced light extraction efficiency.

Another aspect of the present inventive concept provides a method for creating light having multiple wavelengths without using a phosphor.

According to an aspect of the present inventive concept, there is provided a semiconductor light emitting device including: a substrate; a base layer made of a semiconductor of a first conductivity type and disposed on the substrate; a plurality of nanoscale light emitting units disposed in a first region of an upper surface of the base layer, each nanoscale light emitting unit including a first nano-semiconductor layer of a semiconductor of the first conductivity type and protruding from the upper surface of the base layer, a nano-active layer disposed on the first nano-semiconductor layer, and a second nano-semiconductor layer disposed on the nano-active layer and made of a semiconductor of a second conductivity type; and a light emitting laminate disposed in a second region of the upper surface of the base layer different from the first region and having a laminated active layer.

The light emitting laminate may include a first semiconductor layer of the first conductivity type, the laminated active layer disposed on the first semiconductor layer, and a second semiconductor layer of the second conductivity type disposed on the laminated active layer such that surfaces of the first semiconductor layer, the laminated active layer, and the second semiconductor layer are substantially parallel to the upper surface of the substrate.

The nanoscale light emitting units may have a nano-rod shape.

The nanoscale light emitting units may include a plurality of semi-polar surfaces.

The nano-active layer may emit light with a first wavelength band, and the laminated active layer may emit light with a second wavelength band different from the first wavelength band.

The nanoscale light emitting units and the light emitting laminate may emit light having different wavelengths.

The second nano-semiconductor layer and the second semiconductor layer may be electrically insulated from each other.

At least one of the nanoscale light emitting units and the light emitting laminate may be disposed in a plurality of separate regions.

A light emitting laminate or a nanoscale light emitting unit may be disposed on the upper surface of the base layer between two of the plurality of separate regions.

The semiconductor light emitting device may be included in a lighting device including: a light emitting module including the semiconductor light emitting device mounted on a circuit board; a driving unit converting power into a current appropriate for driving the semiconductor light emitting device of the light emitting module; and an external connection unit having a socket structure for receiving power from an external power source and providing the received power to the driving unit.

The semiconductor light emitting device may be included in a vehicle headlamp including: a housing; a light source fixed to the housing and including the semiconductor light emitting device; a lens cover unit fixed to the housing and including a hollow guide having a lens disposed at one end thereof; and a reflective unit fixed to the housing and positioned above the light source to direct light emitted by the light source through the hollow guide to the lens of the lens cover unit.

According to another aspect of the present inventive concept, there is provided a method for manufacturing a semiconductor light emitting device, comprising: forming a light emitting laminate by sequentially laminating a first semiconductor layer of a first conductivity type, a laminated active layer, and a second semiconductor layer of a second conductivity type on a substrate; etching a portion of the laminated active layer and the second semiconductor layer on the substrate to expose a portion of the first semiconductor layer; and forming a plurality of nanoscale light emitting units on the exposed portion of the first semiconductor layer, each nanoscale light emitting unit including a first nano-semiconductor layer of a semiconductor of the first conductivity type extending from the exposed first semiconductor layer, a nano-active layer disposed on the first nano-semiconductor layer, and a second nano-semiconductor layer of a semiconductor of the second conductivity type disposed on the nano-active layer.

The light emitting laminate and the nanoscale light emitting units may be formed in different regions of the substrate.

At least one of the nanoscale light emitting units and the light emitting laminate may be formed in a plurality of separate regions of the substrate.

The laminated active layer of the light emitting laminate may be formed before the forming of the nano-active layer of each nanoscale light emitting unit.

The second nano-semiconductor layer may be formed on an upper surface of the second semiconductor layer in a laminated manner.

The forming of the first nano-semiconductor layer extending from the exposed first semiconductor layer may use a mold filling method.

According to another aspect of the present inventive concept, there is provided a semiconductor light emitting device including: a substrate; a base layer made of a semiconductor of a first conductivity type and disposed on the substrate; a plurality of nanoscale light emitting units spaced apart from each other on an upper surface of the base layer, each nanoscale light emitting unit including a protrusion formed of a semiconductor of the first conductivity type protruding from the upper surface of the base layer, a nano-active layer disposed on the protrusion, and a first semiconductor layer of a second conductivity type disposed on the nano-active layer; and a plurality of light emitting laminate segments disposed in spaces between the plurality of nanoscale light emitting units on the upper surface of the base layer.

Each light emitting laminate segment may include a laminated active layer disposed on the upper surface of the base layer, and a second semiconductor layer of the second conductivity type disposed on the laminated active layer.

Each light emitting laminate segment may be disposed in a space between adjacent nanoscale light emitting units on the upper surface of the base layer, and may extend from a side surface of one nanoscale light emitting unit to a side surface of the adjacent nanoscale light emitting unit.

The first semiconductor layer of each nanoscale light emitting unit may contact the second semiconductor layer of adjacent light emitting laminates.

The first semiconductor layer of each nanoscale light emitting unit may alternatively be electrically isolated from the second semiconductor layer of adjacent light emitting laminates.

BRIEF DESCRIPTION OF THE DRAWINGS

The above and other aspects, features and other advantages of the present inventive concept will be more clearly understood from the following detailed description taken in conjunction with the accompanying drawings, in which.

DETAILED DESCRIPTION OF THE PREFERRED EMBODIMENT

Figure 1:
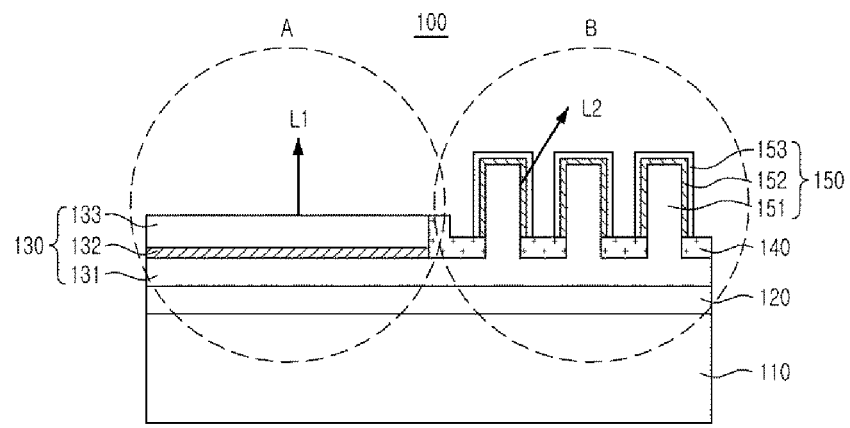
FIG. 1 is a cross-sectional view illustrating a semiconductor light emitting device according to an embodiment of the disclosure.

Embodiments of the present inventive concepts will now be described in detail with reference to the accompanying drawings. The inventive concepts may, however, be embodied in many different forms and should not be construed as being limited to the embodiments set forth herein. Rather, these embodiments are provided so that this disclosure will be thorough and complete, and will fully convey the scope of the inventive concepts to those skilled in the art. In the drawings, the shapes and dimensions of elements may be exaggerated for clarity, and the same reference numerals will be used throughout to designate the same or like components.

FIG. 1 is a cross-sectional view illustrating a semiconductor light emitting device according to an embodiment of the present disclosure.

Referring to FIG. 1, a semiconductor light emitting device 100 according to an embodiment of the present disclosure includes a thin film region A disposed in a substrate 110 and a nanoscale light emitting region B disposed in a region, different from the thin film region A, of the substrate 110.

In detail, the thin film region A includes a light emitting laminate 130 including a base layer made of a first conductivity-type semiconductor layer 131, a laminated active layer 132, and a second conductivity-type semiconductor layer 133 disposed on the substrate 110 or a buffer layer 120. The nanoscale light emitting region B includes a plurality of nanoscale light emitting units 150 including a first conductivity-type nano-semiconductor layer 151 extending from an upper surface of the first conductivity-type semiconductor layer 131. The first conductivity-type nano-semiconductor layer 151 is exposed by and protrudes through openings of an insulating layer 140. A nano-active layer 152 and a second conductivity-type nano-semiconductor layer 153 are disposed on the protrusions of the first conductivity-type nano-semiconductor layer 151 that protrude and are exposed through the insulating layer 140.

The light emitting laminate 130 may include the first conductivity-type semiconductor layer 131, the laminated active layer 132, and the second conductivity-type semiconductor layer 133 sequentially laminated on the substrate 110 and disposed to be substantially parallel to an upper surface of the substrate 110.

Each nanoscale light emitting unit 150 may include the first conductivity-type nano-semiconductor layer 151 extending from the first conductivity-type semiconductor layer 131 and forming one of a plurality of protrusions extending through the insulating layer 140. The nano-active layer 152 covers the protrusion of the first conductivity-type nano-semiconductor layer 151, and the second conductivity-type nano-semiconductor layer 153 covers the nano-active layer 152. Each nanoscale light emitting unit 150 may have a rod shape.

The substrate 110 may be provided as a substrate for semiconductor growth, and may be made of an insulating material, a conductive material, or a semiconductive material such as sapphire, SiC, $MgAl_2O_4$, MgO, $LiAlO_2$, $LiGaO_2$, GaN, or the like. In this case, sapphire commonly used as a semiconductor growth substrate is a crystal having Hexa-Rhombo R3c symmetry, of which lattice constants in c-axis and a-axis directions are 13.001 Å and 4.758 Å, respectively. A sapphire crystal has a C (0001) face, an A (1120) face, an R (1102) face, and the like. In this case, a nitride thin film can be relatively easily grown on the C face of the sapphire crystal, and because sapphire crystal is stable at high temperatures, it is commonly used as a material for a nitride growth substrate. A silicon (Si) substrate may also be appropriately used as the substrate 210, and mass-production can be enhanced by using a silicon (Si) substrate which may have a large diameter and may be relatively low in price. In cases in which a silicon (Si) substrate is used, a nucleation layer including a material such as $Al_xGa_{1-x}N$ may be disposed on the substrate 110 and a nitride semiconductor having a desired structure may be grown on the nucleation layer.

An uneven surface (or a pattern of depression(s) and protrusion(s)) or a sloped surface may be formed on a surface (e.g., one main surface or both main surfaces) or a lateral surface of the substrate 110 to enhance light extraction efficiency. A size of the pattern may be selected from within the range of 5 nm to 500 μm. The size of the pattern may be smaller or larger than the range in consideration of a size of a chip. Any shape or structure may be employed, and shapes and structures that enhance light extraction efficiency are preferentially used. The pattern may be formed of various shapes such as a columnar shape, a peaked shape, a hemispherical shape, and the like.

The buffer layer 120 may optionally be disposed on the substrate 110. The buffer layer 120 may be provided to alleviate lattice mismatching between the substrate 110 and the first conductivity-type semiconductor layer 131.

When a GaN thin film is grown on a heterogeneous substrate, numerous defects may be generated due to a lattice constant mismatch between the substrate and the thin film, and cracks may be generated due to warpage resulting from a difference between coefficients of thermal expansion. In order to control defects and warpage, the buffer layer 120 may be formed on the substrate 110 and a nitride semiconductor having a desired structure may be grown thereon. The buffer layer 120 may be made of AlxInyGa1−x−yN ($0 \leq x \leq 1$, $0 \leq y \leq 1$), and in particular, it can be largely made of GaN, AlN, or AlGaN. Also, materials such as $ZrB_2$, $HfB_2$, ZrN, HfN, and TiN may also be used. Also, a plurality of layers may be combined to be used as the buffer layer 120, or the composition of buffer layer 120 may gradually change through the thickness of the buffer layer 120.

The buffer layer 120 may be disposed at a relatively low temperature without doping. The buffer layer 120 may be omitted.

The first conductivity-type semiconductor layer 131 is disposed on the substrate 110 or the buffer layer 120. The first conductivity-type semiconductor layer 131 may be used as a base layer of the nanoscale light emitting unit(s) 150.

The laminated active layer 132 and the second conductivity-type semiconductor layer 133 are sequentially disposed on the first conductivity-type semiconductor layer 131 of the thin film region 'A', forming the light emitting laminate 130.

The light emitting laminate 130 will be described in detail. The first and second conductivity-type semiconductor layers 131 and 133 may be made of n-type and p-type impurity-doped semiconductors, respectively. However, the present inventive concepts are not limited thereto and, conversely, the first and second conductivity-type semiconductor layers 131 and 133 may be made of p-type and n-type impurity-doped semiconductors, respectively. The first and second conductivity-type semiconductor layers 131 and 133 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). In this case, the present embodiment is not limited thereto and the first and second conductivity-type semiconductor layers 131 and 133 may also be made of a material such as an AlGaInP-based semiconductor or an AlGaAs-based semiconductor. Meanwhile, each of the first and second conductivity-type semiconductor layers 131 and 133 may have a one-layer structure, or, alternatively, each of the first and second conductivity-type semiconductor layers 131 and 133 may have a multilayer structure including layers having different compositions, thicknesses, and the like, as necessary. For example, one or both of the first and second conductivity-type semiconductor layers 131 and 133 may have a carrier injection layer for improving electron and hole injection efficiency, or may have various types of superlattice structures.

Also, the laminated active layer 132 disposed between the first and second conductivity-type semiconductor layers 131 and 133 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used. Meanwhile, the first and second conductivity-type semiconductor layers 131 and 133 and the laminated active layer 132 constituting the light emitting laminate 130 may be grown by metal organic chemical vapor deposition (MOCVD), hydride vapor phase epitaxy (HVPE), molecular beam epitaxy (MBE), or the like.

The nanoscale light emitting units 150 include the first conductivity-type nano-semiconductor layer 151 extending from the first conductivity-type semiconductor layer 131 and exposed through openings of the insulating layer 140, the nano-active layer 152, and the second conductivity-type nano-semiconductor layer 153. The nanoscale light emitting units 150 are disposed on the first conductivity-type semiconductor layer 131 which serves as a base layer of the nanoscale light emitting region 'B'. The nanoscale light emitting units 150 may be on the nanoscale, such that a width, height, and other dimensions of each nanoscale light emitting unit can be in the range of approximately 1 nm to 999 nm.

The insulating layer 140 may be made of a silicon oxide or a silicon nitride. The insulating layer 140 may be made of $Al_2O_3$, $SiO_2$, $TiO_2$, $Si_3N_4$, or the like, for example. The insulating layer 140 may be disposed on the first conductivity-type semiconductor layer 131, and include a plurality of openings exposing portions of the first conductivity-type semiconductor layer 131. Each opening can define a diameter, a length, and a position of a corresponding nanoscale light emitting unit 150 to be grown through the opening using a batch process. The openings may have various shapes. Thus, horizontal cross-sections of the nanoscale light emitting units 150 may vary according to shapes of the openings of the insulating layer 140. The plurality of openings may have the same diameter or may have different diameters. Also, distances between the plurality of openings may be equal or different.

The first conductivity-type nano-semiconductor layer 151 and the second conductivity-type nano-semiconductor layer 153 may be made of n-type and p-type impurity-doped semiconductors, respectively. However, the present inventive concept is not limited thereto and, conversely, the first and second conductivity-type nano-semiconductor layers 151 and 153 may be made of p-type and n-type impurity-doped semiconductors, respectively.

The first-conductivity type nano-semiconductor layer 151 forms protrusions extending upward from the first conductivity-type semiconductor layer 131 through the openings of the insulating layer 140. The first conductivity-type nano-semiconductor layer 151 is formed by growing the first conductivity-type semiconductor layer 131 so as to form the protrusions. A cross-section of the first conductivity-type semiconductor layer 151, and/or of a protrusion of the first conductivity-type semiconductor layer 151, may have a polygonal shape.

The nano-active layer 152 is disposed to cover the first conductivity-type semiconductor layer 151. The nano-active layer 152 may cover an upper portion (or surface(s)) and lateral surfaces of the protrusions in the first conductivity-type nano-semiconductor layer 151. The nano-active layer 152 may be made of a single material such as InGaN, or the like, or may have a multi-quantum well structure in which a quantum barrier layer and a quantum well layer are alternately disposed. For example, the quantum barrier and quantum well layers may be made of GaN and InGaN, respectively. As electrons and holes are combined in the nano-active layer 152, light energy is generated.

The second conductivity-type nano-semiconductor layer 153 may be disposed to cover the nano-active layer 152. The second conductivity-type nano-semiconductor layer 153 may cover an upper portion (or surface(s)) and lateral surfaces of the nano-active layer 152.

In this manner, the semiconductor light emitting device 100 according to an embodiment of the present inventive concepts includes the thin film region A and the nanoscale light emitting region B. The respective active layers of the thin film region A and of the nanoscale light emitting region B may be formed to have different compositions. Accordingly, the respective active layers of the thin film region A and of the nanoscale light emitting region B may emit light with different wavelength bands. For example, when InGaN is grown, the nano-active layer 152 of the nanoscale light emitting region B has a higher content of indium (In) than that of the laminated active layer 132 of the thin film region A, and the content of indium (in) in the laminated active layer 132 of the thin film region A may be smaller. Thus, second light L2 emitted from the nanoscale light emitting region B may have a wavelength longer than that of first light L1 emitted from the thin film region A.

Thus, the semiconductor light emitting device illustrated in FIG. 1 may emit light having multiple wavelengths. Namely, the first light L1 of the thin film region A and the second light L2 of the nanoscale light emitting region B may be simultaneously emitted and may have different wavelengths, thereby providing light having multiple wavelengths. The semiconductor light emitting device can thus provide light having various colors. In particular, white light can be implemented by emitting light beams complementing each other from the thin film region A and from the nanoscale light emitting region B.

Figure 2:
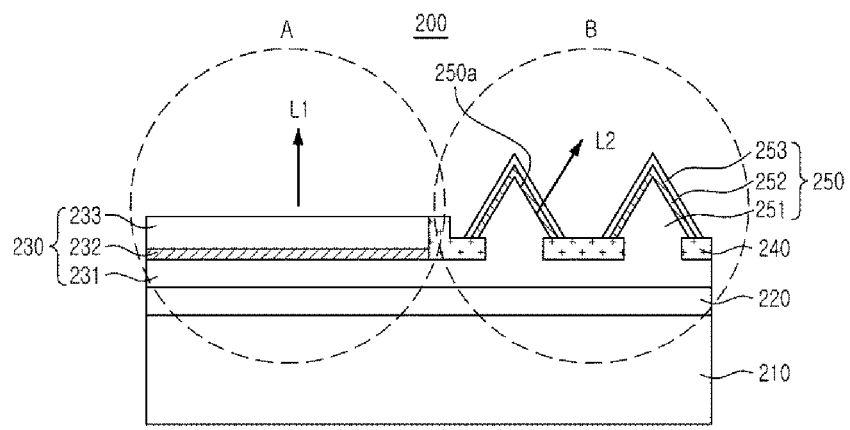
FIG. 2 is a cross-sectional view illustrating a semiconductor light emitting device according to an embodiment of the disclosure.

FIG. 2 is a cross-sectional view illustrating a semiconductor light emitting device according to an embodiment of the present inventive concepts. A semiconductor light emitting device according to the embodiment has the same components as those of the embodiment shown in FIG. 1, except for a shape of the nanoscale light emitting units.

Namely, the semiconductor light emitting device of FIG. 2 includes the thin film region A and the nanoscale light emitting region B disposed on a substrate 210.

In detail, the thin film region A includes a light emitting laminate 230 including a base layer made of a first conductivity-type semiconductor layer 231, a laminated active layer 232, and a second conductivity-type semiconductor layer 233 disposed on the substrate 210 or a buffer layer 220. The nanoscale light emitting region B includes a plurality of nanoscale light emitting units 250 each including a first conductivity-type nano-semiconductor layer 251 extending from the first conductivity-type semiconductor layer 231. The first conductivity-type nano-semiconductor layer 251 is exposed by and protrudes through openings of an insulating layer 240. A nano-active layer 252 and a second conductivity-type nano-semiconductor layer 253 are disposed on the protrusions of the first conductivity-type nano-semiconductor layer 251 that protrude and are exposed through the insulating layer 240.

In FIG. 2, the insulating layer 240 may be provided between the nanoscale light emitting units 250. As illustrated in FIG. 2, the insulating layer 240 may be exposed, rather than being covered by the nanoscale light emitting units 250. Alternatively, in an other example, the nanoscale light emitting units 250 may be formed not to be spaced apart from one another. Thus, in the other example, the insulating layer 240 may be covered by the nanoscale light emitting units 250 so as not to be exposed.

The nanoscale light emitting units 250 may include a plurality of semi-polar surfaces 250a. The semi-polar surfaces 250a may include a sloped surface with respect to the substrate 210. The sloped surface may form an angle with respect to an upper surface of the substrate 210 that is neither orthogonal nor parallel to the upper surface. Also, the nanoscale light emitting units 250 may have a nano-scale.

The size of the nanoscale light emitting units 250 may correspond to the largest diameter of the base side thereof. The nanoscale light emitting unit 250 may have a polypyramid shape.

As for the nanoscale light emitting units 250, for example, the content of indium (In) in an InGaN active layer can be freely increased and crystal defects due to lattice mismatch can be reduced, thereby increasing internal quantum efficiency. Also, each nanoscale light emitting unit 250 has a concavo-convex structure in a direction in which light proceeds, thereby increasing efficiency of extracting light from a material. Thus, the nanoscale light emitting units 250 can be used as a structure increasing external quantum efficiency.

In this manner, the semiconductor light emitting device 200 includes the thin film region A and the nanoscale light emitting region B, and thus, the respective active layers of the thin film region A and the nanoscale light emitting region B can be formed to have different compositions. Thus, the respective active layers of the thin film region A and the nanoscale light emitting region B may emit light with different wavelength bands. Namely, second light L2 emitted from the nanoscale light emitting region B may have a wavelength longer than a wavelength of first light L1 emitted from the thin film region A. Thus, the semiconductor light emitting device illustrated in FIG. 2 may emit light having multiple wavelengths. In particular, a desired wavelength can be freely selected by increasing the content of indium (In) in the InGaN active layer, and thus, first light L1 and second light L2 having different wavelengths may be simultaneously emitted by adjusting wavelengths thereof, thereby implementing light having multiple wavelengths, and thus, various colors can be obtained. In particular, white light can be obtained by emitting light beams complementing each other.

Also, as described above, the openings formed in the insulating layer according to the embodiments of FIGS. 1 and 2 may have different diameters. Also, distances between the openings may be equal (such that the openings are regularly spaced) or different (such that the openings are irregularly spaced).

When openings are formed to have different diameters on a same substrate, nanoscale light emitting units having different diameters may be formed on the same substrate. Also, when the openings are formed on a substrate such that distances therebetween are different, nanoscale light emitting units may be formed such that distances therebetween are different on the substrate. Thus, because the semiconductor light emitting device includes the nanoscale light emitting units having different diameters or being spaced apart from one another by different distances, light beams having various wavelengths may be emitted even in the nanoscale light emitting region B. Namely, the nanoscale light emitting units, grown under the same growth conditions to have different diameters or have different distances therebetween, have different amounts of indium (In), and the nanoscale light emitting units may therefore emit light beams having different wavelengths.

Hereinafter, a method for manufacturing a semiconductor light emitting device such as the semiconductor light emitting device of FIG. 1 will be described with reference to FIGS. 3A through 3H.

Figure 3A:
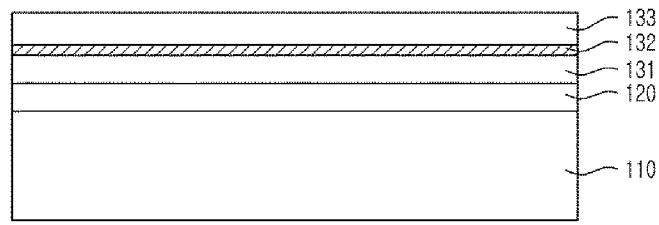
FIGS. 3A through 3H are views illustrating sequential process steps of a method for manufacturing a semiconductor light emitting device according to an embodiment of the disclosure.

First, as illustrated in FIG. 3A, the buffer layer 120, the first conductivity-type semiconductor layer 131, the laminated active layer 132, and the second conductivity-type semiconductor layer 133 are sequentially formed on the substrate 110. The buffer layer 120 may be omitted.

Figure 3B:
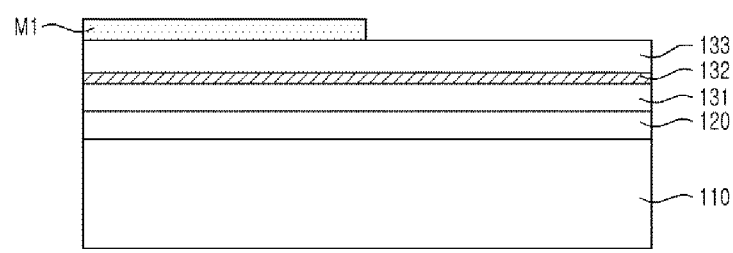
Figure 3C:
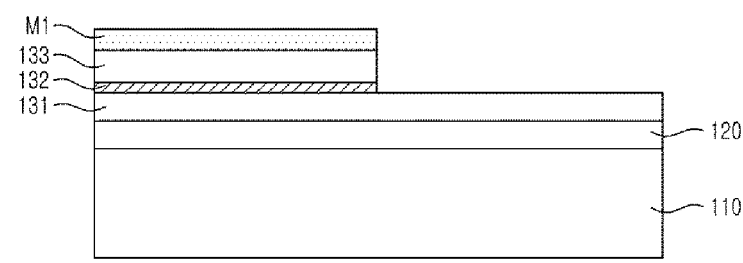

Next, as illustrated in FIG. 3B, a first mask M1 is formed on a region in which the thin film region A is to be formed, and as illustrated in FIG. 3C, the laminated active layer 132 and the second conductivity-type semiconductor layer 133 are etched by using the first mask M1 as an etching mask to expose the first conductivity-type semiconductor layer 131 in a region in which the nanoscale light emitting region B is to be formed.

Figure 3D:
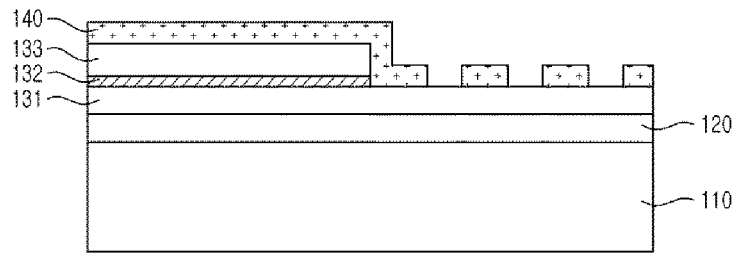

Subsequently, as illustrated in FIG. 3D, the insulating layer 140 is formed on the exposed first conductivity-type semiconductor layer 131 and the second conductivity-type semiconductor layer 133, and openings exposing the first conductivity-type semiconductor layer 131 are formed in the insulating layer 140. The shape, size, and spacing of the openings determine a diameter, a length, and positions of nanoscale light emitting units to be grown through a comprehensive process (integral process, like a batch process).

Figure 3E:
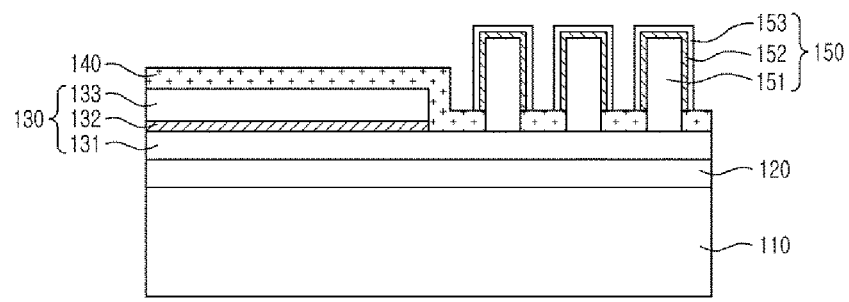

Thereafter, as illustrated in FIG. 3E, the first conductivity-type nano-semiconductor layer 151, which extends from regions of the first conductivity-type semiconductor layer 131 that are exposed through the plurality of openings of the insulating layer 140, is formed. Thereafter, the nano-active layer 152 is formed on the surface of the first conductivity-type nano-semiconductor layer 151, and the second conductivity-type nano-semiconductor layer 153 is formed on the nano-active layer 152 to cover the nano-active layer 152. Accordingly, the nanoscale light emitting units 150 including the first conductivity-type nano-semiconductor layer 151, the nano-active layer 152, and the second conductivity-type nano-semiconductor layer 153 are formed.

Figure 3F:
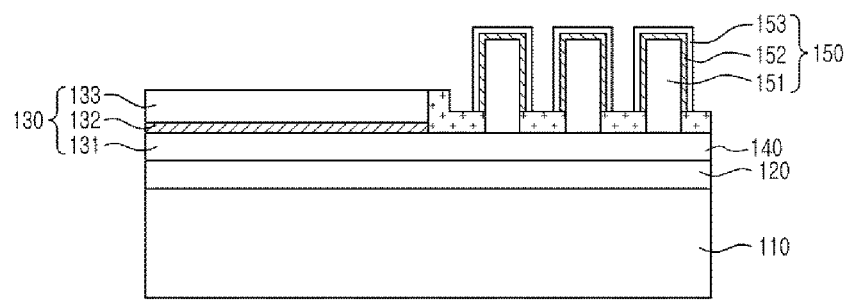

Thereafter, as illustrated in FIG. 3F, the insulating layer 140 formed on the second conductivity-type semiconductor layer 133 is removed.

In this manner, the semiconductor light emitting device 100 according to the embodiment of FIG. 1 may be formed.

Figure 3G:
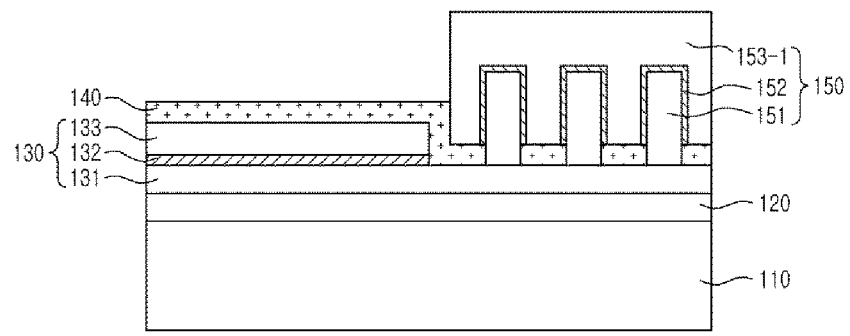

In an alternative process, after the process illustrated in FIG. 3D, the first conductivity-type nano-semiconductor layer 151 may be formed to extend from regions of the first conductivity-type semiconductor layer 131 that are exposed through the plurality of openings of the insulating layer 140 and the nano-active layer 152 may be formed on the first conductivity-type nano-semiconductor layer 151. Thereafter, a second conductivity-type nano-semiconductor layer 153-1 may be formed to have a predetermined height (or thickness) to cover the entirety of the first conductivity-type nano-semiconductor layer 151 and the nano-active layer 152 as illustrated in FIG. 3G, rather than being formed along the surface of the nano-active layer 152. The second conductivity-type nano-semiconductor layer 153-1 may fill a space between the protrusions formed by the first conductivity-type nano-semiconductor layer 151, and may be formed to a substantially uniform predetermined height (or thickness) measured from an upper surface of the first conductivity-type semiconductor layer 131.

Figure 3H:
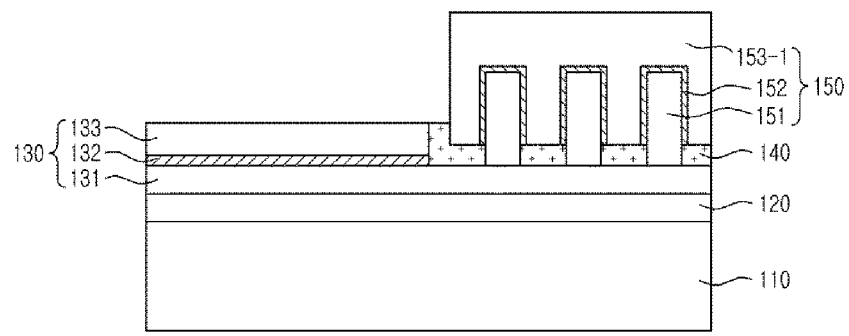

Thereafter, the insulating layer 140 formed on the second conductivity-type semiconductor layer 133 is removed to form the semiconductor light emitting device having such a configuration as shown in FIG. 3H.

Figure 4:
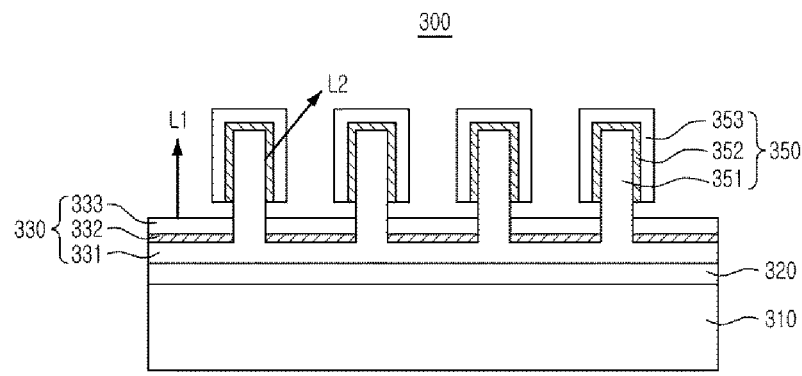
FIG. 4 is a cross-sectional view illustrating a semiconductor light emitting device according to an embodiment of the disclosure.

FIG. 4 is a cross-sectional view illustrating a semiconductor light emitting device according to an embodiment of the present inventive concepts.

Referring to FIG. 4, a semiconductor light emitting device 300 according to the embodiment of the present inventive concepts includes a base layer made of a first conductivity-type semiconductor layer 331 formed on a substrate 310, and a plurality of nanoscale light emitting units 350 may be arranged to be spaced apart from one another on the first conductivity-type semiconductor layer 331.

The nanoscale light emitting units 350 may include a first conductivity-type nano-semiconductor layer 351, a nano-active layer 352, and a second conductivity-type nano-semiconductor layer 353.

In FIG. 4, nanoscale light emitting units 350 having a rod-like shape are illustrated, but the inventive concepts are not limited to the rod-like shape and the nanoscale light emitting units 350 may have a pyramid shape. Namely, the nanoscale light emitting units 350 may include a plurality of semi-polar surfaces. The semi-polar surfaces may include a sloped surface with respect to an upper surface of the substrate 310.

Light emitting laminates 330 may be provided in segments disposed between the plurality of nanoscale light emitting units 350. Namely, the nanoscale light emitting units 350 and the light emitting laminate 330 may be alternately arranged along the surface of the substrate 310. However, the present inventive concepts are not limited thereto and at least one of the nanoscale light emitting unit 350 or the light emitting laminate 330 may be disposed in a plurality of separated regions.

The light emitting laminate 330 may include a first conductivity-type semiconductor layer 331, a laminated active layer 332, and a second conductivity-type semiconductor layer 333. The second conductivity-type nano-semiconductor layer 353 and the second conductivity-type semiconductor layer 333 may exist separately.

The substrate 310, the light emitting laminate 330 including the first conductivity-type semiconductor layer 331, the laminated active layer 332, and the second conductivity-type semiconductor layer 333, and the nanoscale light emitting units 350 are substantially similar to those illustrated in FIG. 1, so detailed descriptions thereof will be omitted. Also, same or similar components in FIGS. 1 and 4 perform substantially the same functions and operations, so detailed descriptions thereof will be omitted.

The laminated active layer 332 of the light emitting laminate 330 and the nano-active layer 352 of the nanoscale light emitting units 350 may have different compositions, and thus, emit light having different wavelengths. Namely, first light L1 emitted from the light emitting laminate 330 may have a wavelength shorter than that of second light L2 emitted from the nanoscale light emitting units 350. Thus, the light emitting device illustrated in FIG. 4 may emit light having multiple wavelengths. Thus, various colors may be emitted and, in particular, white light can be obtained by emitting light beams having complementary colors to each other.

Hereinafter, a method for manufacturing a semiconductor light emitting device according to the embodiment of FIG. 4 will be described with reference to FIGS. 5A through 5E.

Figure 5A:
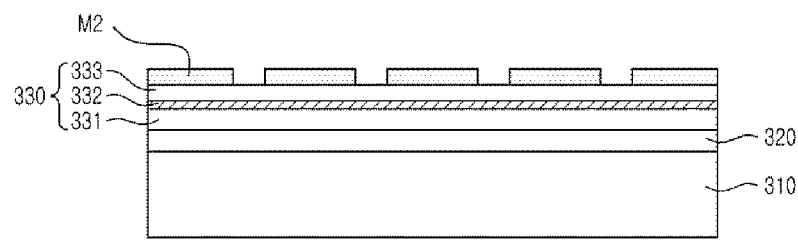
FIGS. 5A through 5E are views illustrating sequential process steps of a method for manufacturing a semiconductor light emitting device according to an embodiment of the disclosure.

First, as illustrated in FIG. 5A, an optional buffer layer 320, the first conductivity-type semiconductor layer 331, the laminated active layer 332, and the second conductivity-type semiconductor layer 333 are sequentially formed on the substrate 310, and a second mask M2 exposing regions in which nanoscale light emitting units are to be disposed is formed on the second conductivity-type semiconductor layer 333. The buffer layer 320 is optional and may be omitted.

Figure 5B:
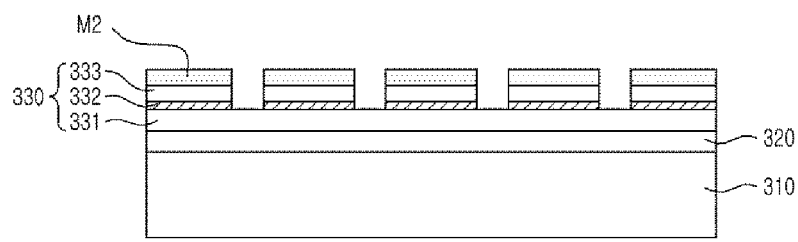

Next, as illustrated in FIG. 5B, the laminated active layer 332 and the second conductivity-type semiconductor layer 333 are etched by using the second mask M2 as an etching mask, so as to expose portions of the first conductivity-type semiconductor layer 331 located under openings in the second mask M2.

Figure 5C:
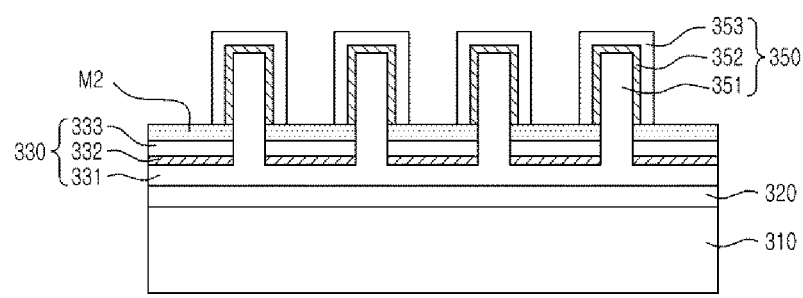

Thereafter, as illustrated in FIG. 5C, the first conductivity-type nano-semiconductor layer 351 extending from the first conductivity-type semiconductor layer 331 and having a protruded structure is formed. The first conductivity-type nano-semiconductor layer 351 forms a plurality of protrusions extending outward from the first conductivity-type nano-semiconductor layer 351 through the openings in the second mask M2. Thereafter, the nano-active layer 352 is formed on the first conductivity-type nano-semiconductor layer 351, and the second conductivity-type nano-semiconductor layer 353 is formed on the nano-active layer 352 to cover the entirety of the nano-active layer 352. Accordingly, the nanoscale light emitting units 350 including the first conductivity-type nano-semiconductor layer 351, the nano-active layer 352, and the second conductivity-type nano-semiconductor layer 353 are formed.

Figure 5D:
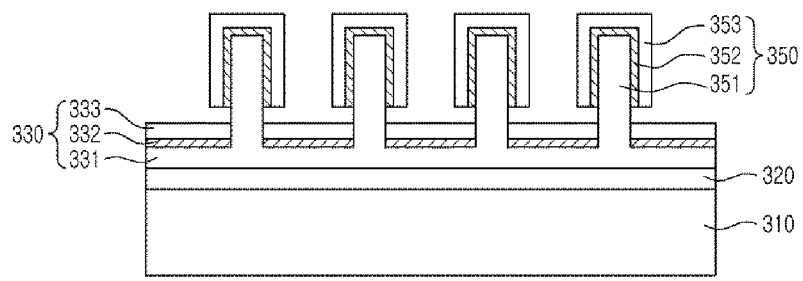

Thereafter, as illustrated in FIG. 5D, the second mask M2 formed on the second conductivity-type semiconductor layer 333 is removed.

In this manner, the semiconductor light emitting device 300 according to the embodiment of FIG. 4 may be formed.

Figure 5E:
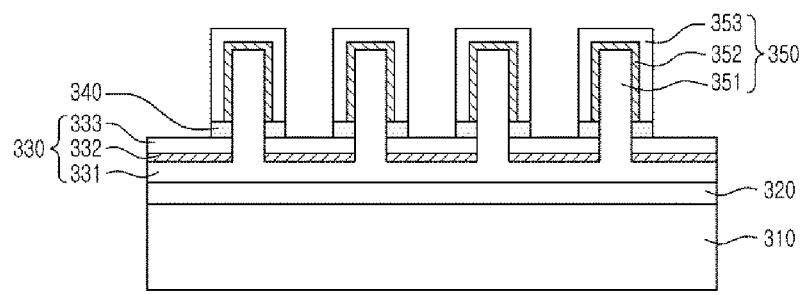

In an alternative process, after the process illustrated in FIG. 5C, the second mask M2 may be removed through anisotropic etching, rather than being entirely removed, to form the insulating layer 340 under the nanoscale light emitting unit 350 as illustrated in FIG. 5E.

Alternatively, after the process illustrated in FIG. 5D, the insulating layer 340 may be selectively formed under an overhang of the nanoscale light emitting units 350 to form the semiconductor light emitting device illustrated in FIG. 5E.

Figure 6:
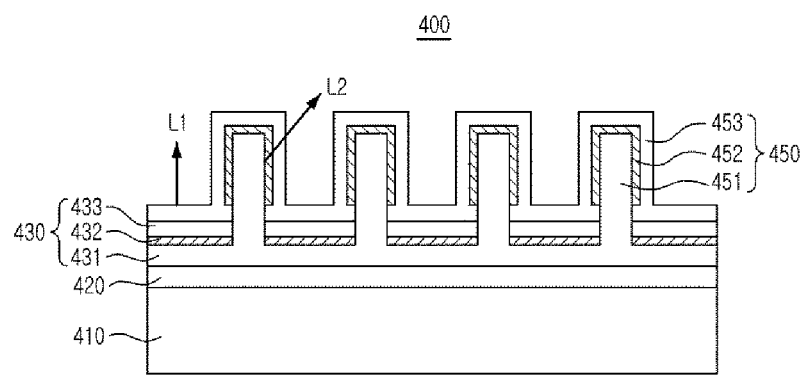
FIG. 6 is a cross-sectional view illustrating a semiconductor light emitting device according to an embodiment of the disclosure.

FIG. 6 is a cross-sectional view illustrating a semiconductor light emitting device according to another embodiment of the present inventive concepts.

Referring to FIG. 6, a semiconductor light emitting device 400 may include a first conductivity-type semiconductor layer 431 as a base layer formed on a substrate 410 and a plurality of nanoscale light emitting units 450 arranged to be spaced apart from one another on the first conductivity-type semiconductor layer 431.

The nanoscale light emitting units 450 may each include a first conductivity-type nano-semiconductor layer 451, a nano-active layer 452, and a second conductivity-type nano-semiconductor layer 453.

In FIG. 6, the nanoscale light emitting units 450 have a rod-like shape, but the present inventive concept is not limited to rod-like shaped units and the nanoscale light emitting units 450 may alternatively have a pyramid shape. Namely, the nanoscale light emitting units 450 may include a plurality of semi-polar surfaces. The semi-polar surfaces may include a sloped surface with respect to a main surface of the substrate 410.

A light emitting laminate 430 may be provided between the plurality of nanoscale light emitting units 450. Namely, the nanoscale light emitting units 450 and the light emitting laminate 430 may be alternately arranged along the surface of the substrate 410. However, alternatively, at least one of the nanoscale light emitting units 450 and the light emitting laminate 430 may be formed in a plurality of separated regions.

The light emitting laminate 430 may include a first conductivity-type semiconductor layer 431, a laminated active layer 432, and a second conductivity-type semiconductor layer 433.

In the present embodiment, the second conductivity-type nano-semiconductor layer 453 may cover the entirety of the second conductivity-type semiconductor layer 433 and the nano-active layer 452.

Figure 7:
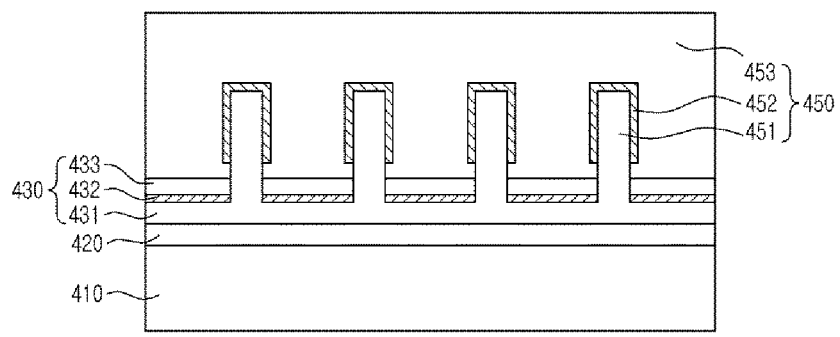
FIG. 7 is a cross-sectional view illustrating another semiconductor light emitting device according to an embodiment of the disclosure.

However, as illustrated in FIG. 7, a second conductivity-type nano-semiconductor layer 453 may be formed to have a predetermined height (or thickness) to cover the entirety of the light emitting laminate 430 and the nanoscale light emitting units 450. In the example of FIG. 7, the second conductivity-type nano-semiconductor layer 453 may fill a space between the protrusions formed by the first conductivity-type nano-semiconductor layer 451, and may be formed to a substantially uniform predetermined height (or thickness) measured from an upper surface of the first conductivity-type semiconductor layer 431.

In the embodiments of FIGS. 6 and/or 7, a second conductivity-type nano-semiconductor layer 453 may be disposed on the second conductivity-type semiconductor layer 433.

Thus, the second conductivity-type nano-semiconductor layer 453 and the second conductivity-type semiconductor layer 433 may be connected. Also, the second conductivity-type semiconductor layer 433 and the second conductivity-type nano-semiconductor layer 453 may be made of the same material.

Namely, the semiconductor light emitting device according to the embodiments of FIGS. 6 and/or 7 are different from the semiconductor light emitting device according to the embodiment of FIG. 4 in terms of the position and configuration of the second conductivity-type nano-semiconductor layer 453.

In the embodiments of FIGS. 6 and 7, the first conductivity-type nano-semiconductor layer 451 and the second conductivity-type nano-semiconductor layer 453 may be in direct contact without the nano-active layer 452 therebetween in a lower portion of the nanoscale light emitting units 450. However, the contact area between the first conductivity-type nano-semiconductor layer 451 and the second conductivity-type nano-semiconductor layer 453 is very small relative to a light emitting area. Here, an insulating layer may be selectively formed below the nanoscale light emitting unit 450 so as to be disposed between the first conductivity-type nano-semiconductor layer 451 and the second conductivity-type nano-semiconductor layer 453 in regions in which the nano-active layer 452 is not present.

Hereinafter, a method for manufacturing a semiconductor light emitting device according to the embodiment of FIG. 7 will be described in relation to FIGS. 8A through 8E.

Figure 8A:
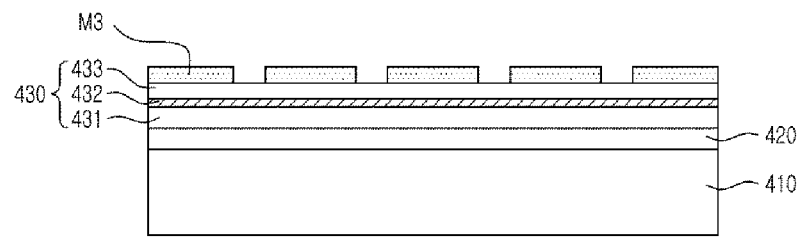
FIGS. 8A through 8E are views illustrating sequential process steps of a method for manufacturing a semiconductor light emitting device according to an embodiment of the disclosure.

First, as illustrated in FIG. 8A, an optional buffer layer 420, the first conductivity-type semiconductor layer 431, the laminated active layer 432, and the second conductivity-type semiconductor layer 433 are sequentially formed on the substrate 410, and a third mask M3 exposing regions in which nanoscale light emitting units are to be formed is formed on the second conductivity-type semiconductor layer 433. The buffer layer 420 is optional and may be omitted.

Figure 8B:
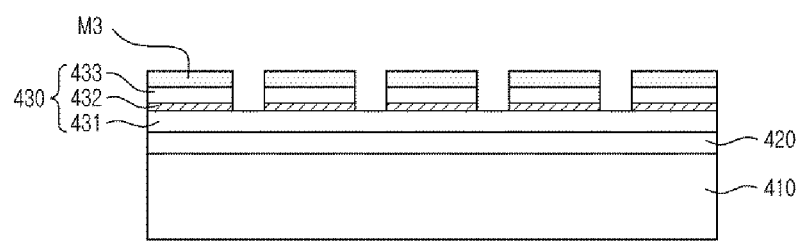

Next, as illustrated in FIG. 8B, the laminated active layer 432 and the second conductivity-type semiconductor layer 433 are etched by using the third mask M3 as an etching mask to expose portions of the first conductivity-type semiconductor layer 431 located beneath openings in the third mask M3.

Figure 8C:
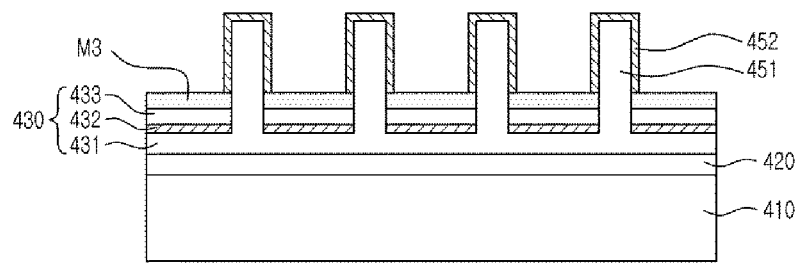

Subsequently, as illustrated in FIG. 8C, the first conductivity-type nano-semiconductor layer 451, which extends from the exposed first conductivity-type semiconductor layer 431, is formed as a set of protrusions extending upwards from exposed portions of the first conductivity-type semiconductor layer 431 through the openings in the laminated active layer 432, the second conductivity-type semiconductor layer 433, and the third mask M3. Thereafter, the nano-active layer 452 is formed on the first conductivity-type nano-semiconductor layer 451.

Figure 8D:
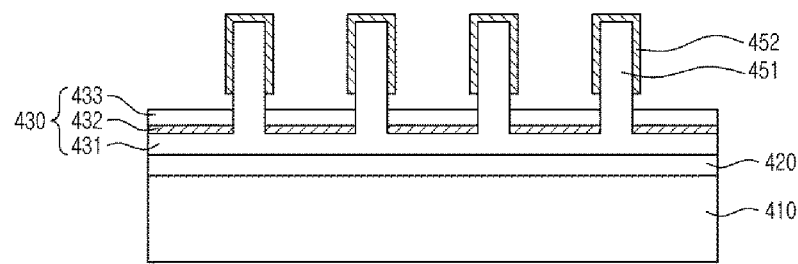

Thereafter, as illustrated in FIG. 8D, the third mask M3 formed on the second conductivity-type semiconductor layer 433 is removed.

Figure 8E:
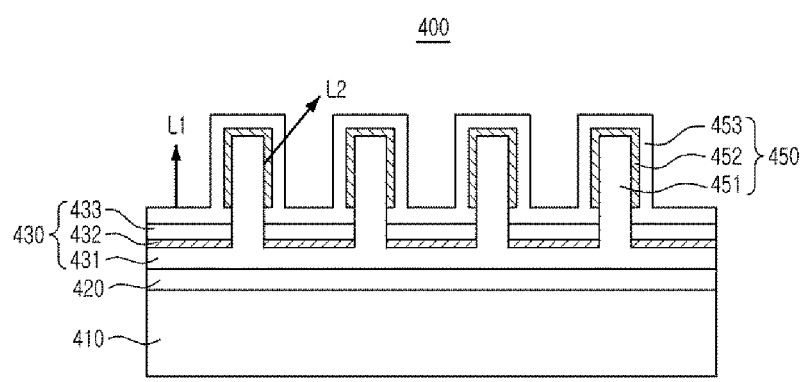

Thereafter, as illustrated in FIG. 8E, the second conductivity-type nano-semiconductor layer 453 is formed to cover the entirety of the second conductivity-type semiconductor layer 433 and the nano-active layer 452.

As illustrated in FIG. 7, the second conductivity-type nano-semiconductor layer 453 may optionally be formed to have a predetermined height (or thickness) to cover the entirety of the light emitting laminate 430 and the nanoscale light emitting units 450.

After the process illustrated in FIG. 8C, the third mask M3 may be removed through anisotropic etching, rather than being entirely removed, to form an insulating layer under the overhang of the nanoscale light emitting units 450, or after the process illustrated in FIG. 8D, an insulating layer may be selectively formed under the overhang of the nanoscale light emitting units 450. The overhang corresponds to a portion of the nano-active layer 452 that extends laterally outwards from lateral surfaces of the protrusions of the first conductivity-type nano-semiconductor layer 451.

Figure 9:
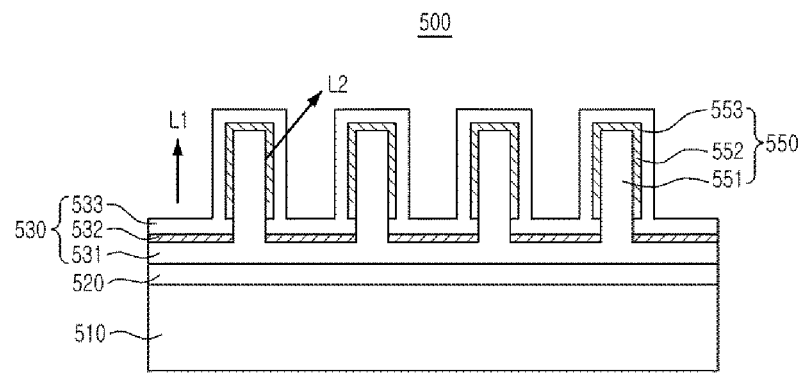
FIG. 9 is a cross-sectional view illustrating another example of the semiconductor light emitting device according to an embodiment of the disclosure.

FIG. 9 is a cross-sectional view illustrating another example of the semiconductor light emitting device according to an embodiment of the present inventive concepts.

Referring to FIG. 9, a semiconductor light emitting device 500 may include a base layer made of a first conductivity-type semiconductor layer 531 formed on a substrate 510 and a plurality of nanoscale light emitting units 550 arranged to be spaced apart from one another on the first conductivity-type semiconductor layer 531.

The nanoscale light emitting units 550 may include a first conductivity-type nano-semiconductor layer 551, a nano-active layer 552, and a second conductivity-type semiconductor layer 533.

In FIG. 9, the nanoscale light emitting unit 550 have a rod-like shape, but the present inventive concepts are not limited thereto and the nanoscale light emitting units 550 may have a pyramid shape. Namely, the nanoscale light emitting units 550 may include a plurality of semi-polar surfaces. The semi-polar surfaces may include a sloped surface with respect to the substrate 510.

A light emitting laminate 530 may be provided between the plurality of nanoscale light emitting units 550. Namely, the nanoscale light emitting units 550 and the light emitting laminate 530 may be alternately arranged along the surface of the substrate 510. However, the present inventive concept is not limited thereto and at least one of the nanoscale light emitting units 550 and the light emitting laminate 530 may be disposed in a plurality of separated regions.

The light emitting laminate 530 may include a first conductivity-type semiconductor layer 531, a laminated active layer 532, and a second conductivity-type semiconductor layer 533.

In the present embodiment, the second conductivity-type semiconductor layer 533/553 may cover the entirety of the laminated active layer 532 and the nano-active layer 552.

Hereinafter, a method for manufacturing a semiconductor light emitting device according to the embodiment of FIG. 9 will be described with reference to FIGS. 10A through 10I.

Figure 10A:
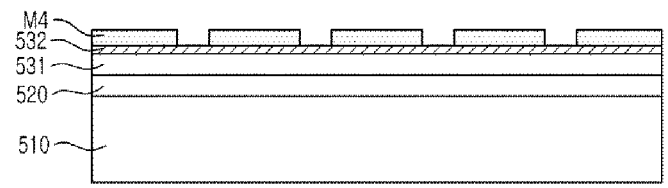
FIGS. 10A through 10I are views illustrating sequential process steps of a method for manufacturing a semiconductor light emitting device according to an embodiment of the disclosure.

First, as illustrated in FIG. 10A, an optional buffer layer 520, the first conductivity-type semiconductor layer 531, and the laminated active layer 532 are sequentially formed on the substrate 510, and a fourth mask M4 exposing regions in which nanoscale light emitting units are to be disposed is formed on the laminated active layer 532. Here, the buffer layer 520 is optional and may be omitted.

Figure 10B:
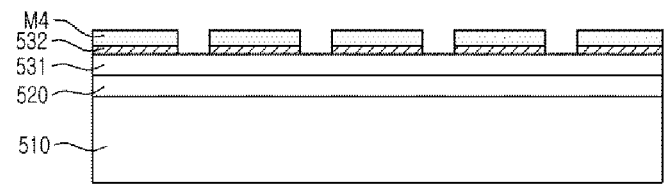

Next, as illustrated in FIG. 10B, the laminated active layer 532 is etched by using the fourth mask M4 as an etching mask to expose portions of the first conductivity-type semiconductor layer 531 located below openings in the fourth mask M4.

Figure 10C:
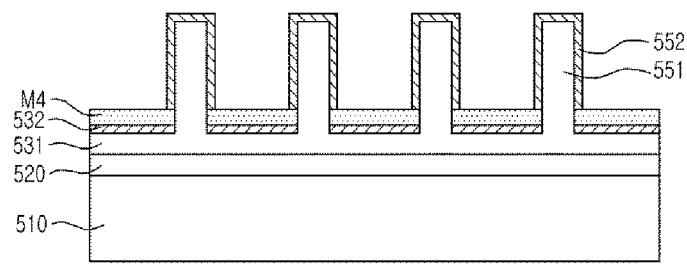

Subsequently, as illustrated in FIG. 10C, the first conductivity-type nano-semiconductor layer 551 is formed to extend from the exposed first conductivity-type semiconductor layer 531 and protrude from an upper surface of the first conductivity-type semiconductor layer 531 through the openings in the fourth mask M4. Thereafter, the nano-active layer 552 is formed on the first conductivity-type nano-semiconductor layer 551.

Figure 10D:
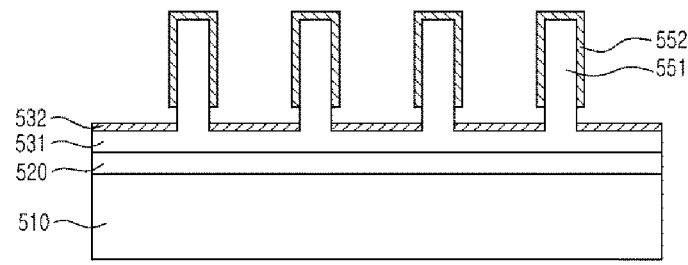

Thereafter, as illustrated in FIG. 10D, the fourth mask M4 formed on the laminated active layer 532 is removed.

Figure 10E:
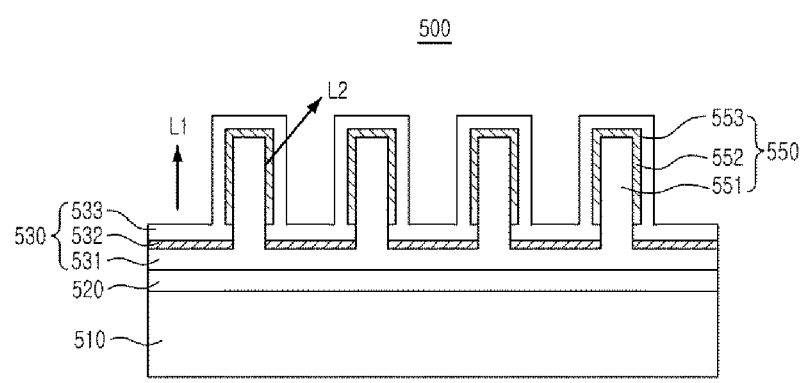

Thereafter, the second conductivity-type semiconductor layer 533/553 is formed to cover the entirety of the laminated active layer 532 and the nano-active layer 552 to form the semiconductor light emitting device 500 of FIG. 10E.

Figure 10F:
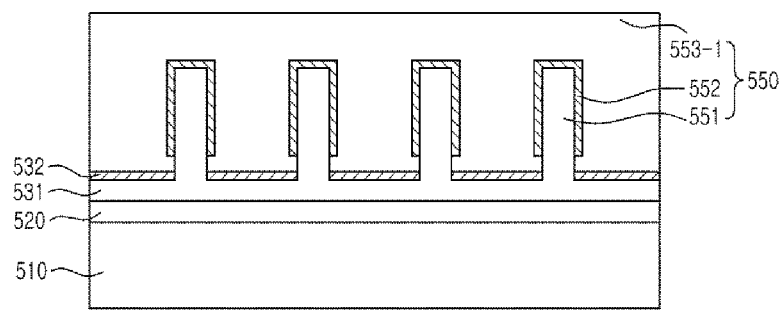

Here, as illustrated in FIG. 10F, a second conductivity-type semiconductor layer 553-1 may be formed to have a predetermined height (or thickness) to cover the light emitting laminate 530 and the nanoscale light emitting unit 550. The second conductivity-type semiconductor layer 553-1 may fill spaces between protrusions formed by the first conductivity-type nano-semiconductor layer 551, and may be formed to a substantially uniform predetermined height (or thickness) measured from an upper surface of the first conductivity-type semiconductor layer 531.

At this time, an electrode may be formed in the semiconductor light emitting device 500 according to the present embodiment of the present inventive concept.

Figure 10G:
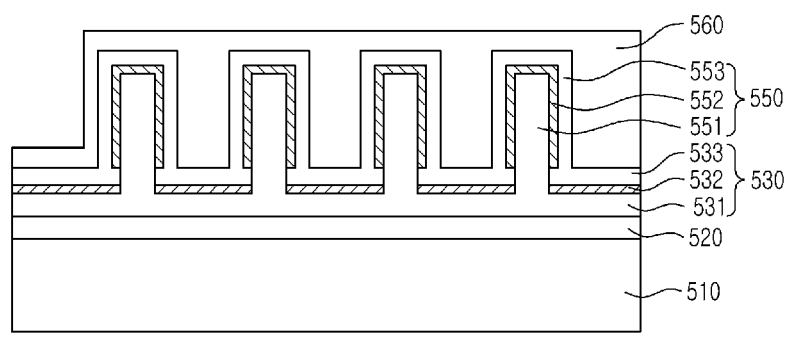

Following FIG. 10E, as illustrated in FIG. 10G, an electrode layer 560 is formed on the second conductivity-type semiconductor layer 533/553 to cover the entirety thereof. The electrode layer 560 is determined according to a type of the semiconductor light emitting device 500 used in the fifth embodiment. Namely, in a case in which the semiconductor light emitting device 500 has an epi-up structure, the electrode layer 560 may be made of a transparent material, preferably, indium tin oxide (ITO). However, in a case in which the semiconductor light emitting device 500 has a flipchip structure, the electrode layer 560 may be made of a light reflective material, e.g., a highly reflective metal. In this case, the light emitting device 500 may be mounted such that first and second electrodes 570 and 580 (shown in FIG. 10I) face a lead frame, or the like, of a package.

Figure 10H:
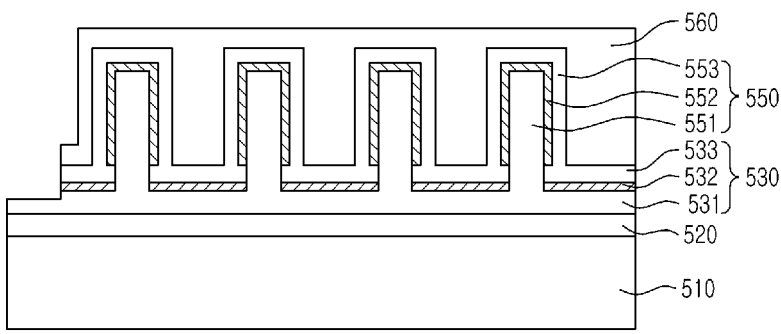

Thereafter, as illustrated in FIG. 10H, portions of the electrode layer 560, the second conductivity-type semiconductor layer 533, and the laminated active layer 532 are etched to expose the first conductivity-type semiconductor layer 531.

Figure 10I:
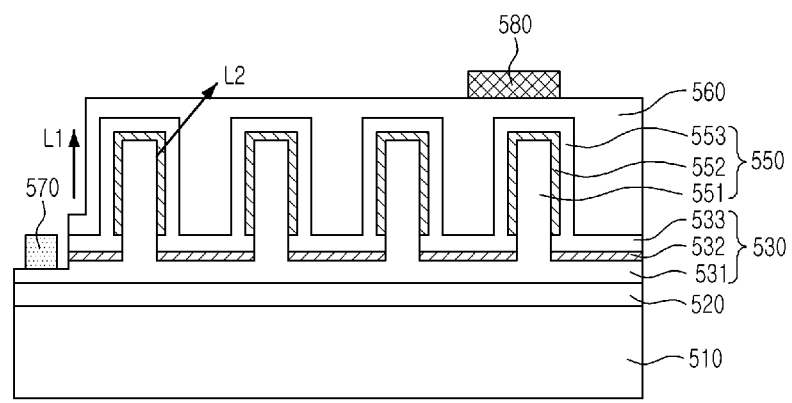

Thereafter, as illustrated in FIG. 10I, the first electrode 570 and the second electrode 580 are formed on the exposed first conductivity-type semiconductor layer 531 and on the electrode layer 560, respectively. The first and second electrodes 570 and 580 may be formed to have various shapes other than those shown in FIG. 10I.

Figure 11:
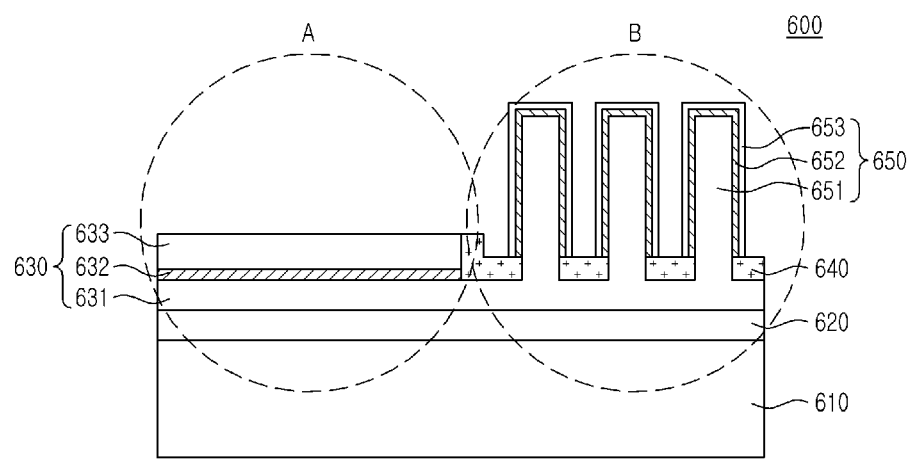
FIG. 11 is a cross-sectional view illustrating another example of the semiconductor light emitting device according to an embodiment of the disclosure.

FIG. 11 is a cross-sectional view illustrating another example of a semiconductor light emitting device according to an embodiment of the present inventive concepts.

Referring to FIG. 11, a semiconductor light emitting device 600 according to the sixth embodiment of the present inventive concepts includes a thin film region A and a nanoscale light emitting region B formed on a substrate 610.

In detail, the thin film region A includes a light emitting laminate 630 including a base layer made of a first conductivity-type semiconductor layer 631, a laminated active layer 632, and a second conductivity-type semiconductor layer 633 formed on the substrate 610 or on an optional buffer layer 620. The nanoscale light emitting region B includes a plurality of nanoscale light emitting units 650 each including a first conductivity-type nano-semiconductor layer 651 extending from the first conductivity-type semiconductor layer 631 exposed by openings of an insulating layer 640, a nano-active layer 652, and a second conductivity-type nano-semiconductor layer 653.

In FIG. 11, the semiconductor light emitting device includes the thin film region A and the nanoscale light emitting region B arranged side-by-side on a main surface of the substrate 610, but the semiconductor light emitting device may have a structure in which the nanoscale light emitting units 650 and the light emitting laminate 630 are alternately arranged. The present inventive concepts are not limited to any particular configuration of the nanoscale light emitting units 650 and the light emitting laminate 630, and at least one of the nanoscale light emitting units 650 and the light emitting laminate 630 may be disposed in a plurality of separated regions.

Hereinafter, a method for manufacturing a semiconductor light emitting device according to the embodiment of FIG. 11 will be described with reference to FIGS. 12A through 12N.

Figure 12A:
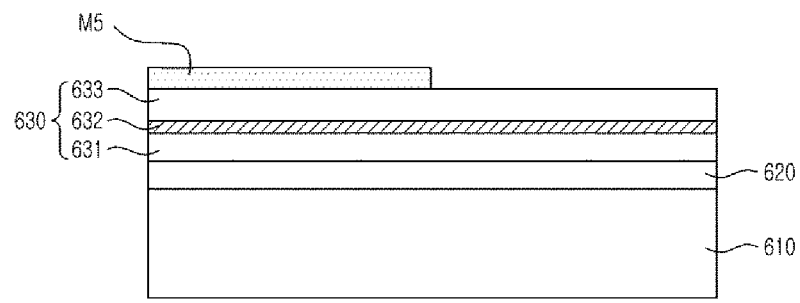
FIGS. 12A through 12N are views illustrating sequential process steps of a method for manufacturing a semiconductor light emitting device according to an embodiment of the disclosure.

First, as illustrated in FIG. 12A, the optional buffer layer 620, the first conductivity-type semiconductor layer 631, the laminated active layer 632, and the second conductivity-type semiconductor layer 633 are sequentially formed on the substrate 610, and a fifth mask M5 is formed in a region in which the thin film region A is to be disposed. Here, the buffer layer 620 is optional and may be omitted.

Figure 12B:
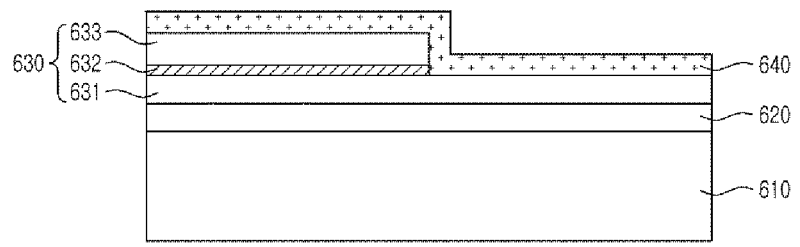

Next, as illustrated in FIG. 12B, the laminated active layer 632 and the second conductivity-type semiconductor layer 633 are etched by using the fifth mask M5 as an etching mask to expose portions of the first conductivity-type semiconductor layer 531, the fifth mask M5 is removed, and the insulating layer 640 is formed on the exposed first conductivity-type semiconductor layer 631 and the second conductivity-type semiconductor layer 533.

Figure 12C:
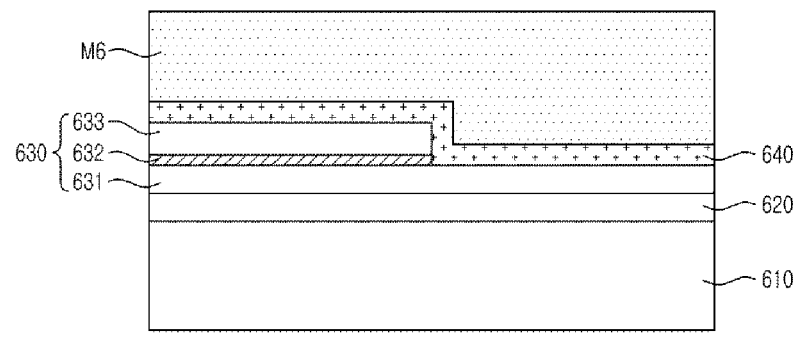

Thereafter, as illustrated in FIG. 12C, a mold M6 is applied to the surface of the insulating layer 640. The mold M6 may extend to a particular distance (or height) from the surface of the first conductivity-type semiconductor layer 631.

Figure 12D:
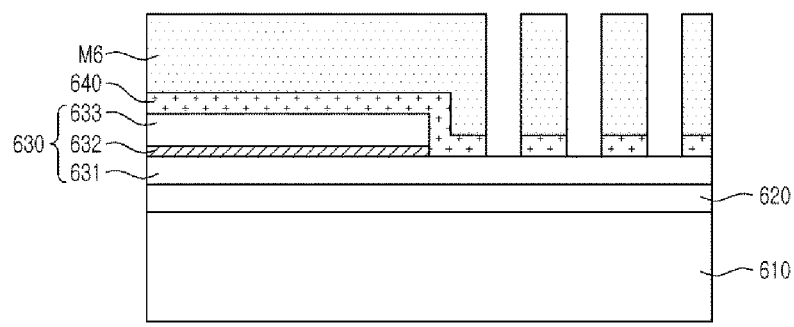

Subsequently, as illustrated in FIG. 12D, a plurality of openings exposing the first conductivity-type semiconductor layer 631 are formed in the region of the mold M6 in which the nanoscale light emitting region B is to be disposed. Namely, the mold M6 and the insulating layer 640 are simultaneously etched to expose the first conductivity-type semiconductor layer 631.

The openings are means for defining a diameter, a length, and a position of the nanoscale light emitting units 650 to be grown through a batch process. The openings may have various shapes.

Figure 12E:
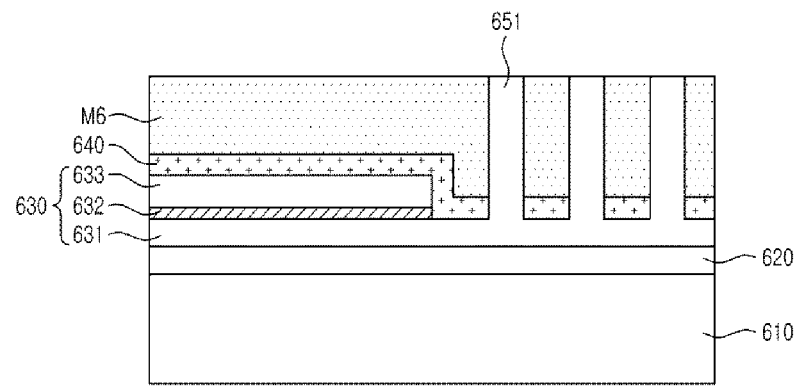

Subsequently, as illustrated in FIG. 12E, the first conductivity-type nano-semiconductor layer 651, which extends from the exposed first conductivity-type semiconductor layer 631, is formed as a plurality of protrusions extending from exposed portions of the surface of the first conductivity-type semiconductor layer 631. Here, the first conductivity-type nano-semiconductor layer 651 may be formed by using a mold filling method.

Figure 12F:
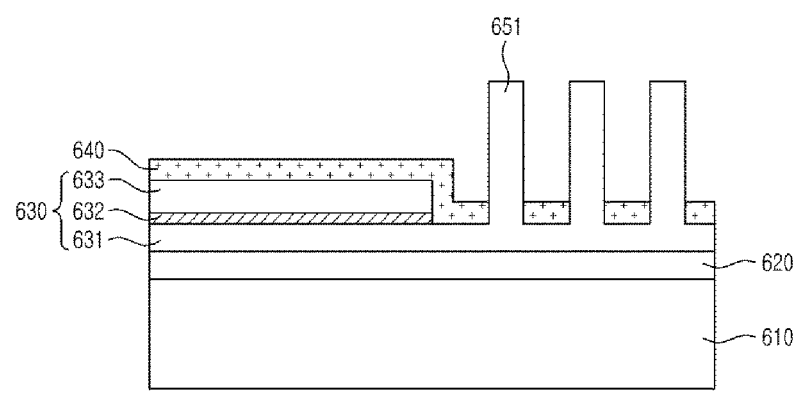

Subsequently, as illustrated in FIG. 12F, the mold M6 is removed.

Figure 12G:
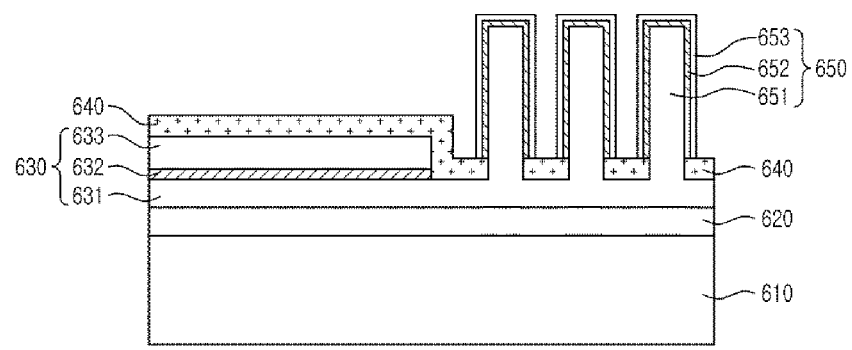

Thereafter, as illustrated in FIG. 12G, the nano-active layer 652 is formed on the protrusions of the first conductivity-type nano-semiconductor layer 651, and the second conductivity-type nano-semiconductor layer 653 is formed on the nano-active layer 652 to cover the entirety thereof. Accordingly, the nanoscale light emitting units 650 including the first conductivity-type nano-semiconductor layer 651, the nano-active layer 652, and the second conductivity-type nano-semiconductor layer 653 are formed.

Figure 12H:
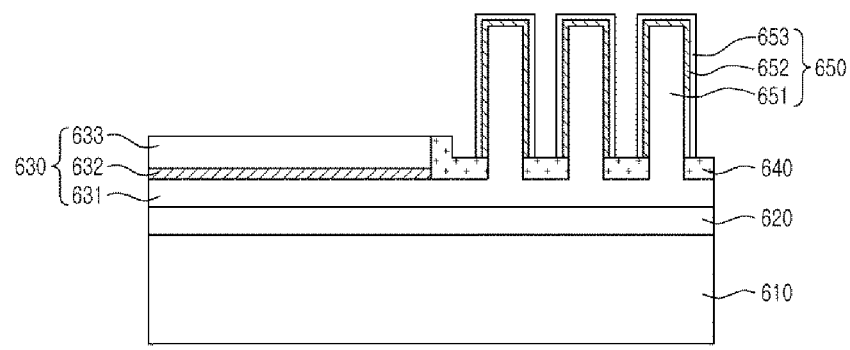

Subsequently, as illustrated in FIG. 12H, the insulating layer 640 formed on the second conductivity-type semiconductor layer 633 is removed.

In this manner, the semiconductor light emitting device 600 according to the embodiment of the present inventive concept in FIG. 11 is formed.

In this case, an electrode may be formed in the semiconductor light emitting device 600.

Figure 12I:
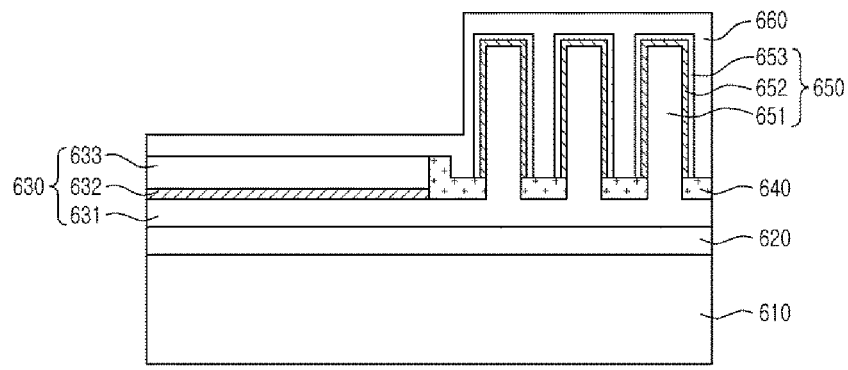

Following FIG. 12H, as illustrated in FIG. 12I, an electrode layer 660 is formed on the second conductivity-type semiconductor layer 633 and on the second conductivity-type nano-semiconductor layer 653 to cover the entirety thereof. The electrode layer 660 may be made of a transparent material, preferably, indium tin oxide (ITO). The electrode layer 660 may fill gaps formed between adjacent protrusions of the nanoscale light emitting units 650.

Figure 12J:
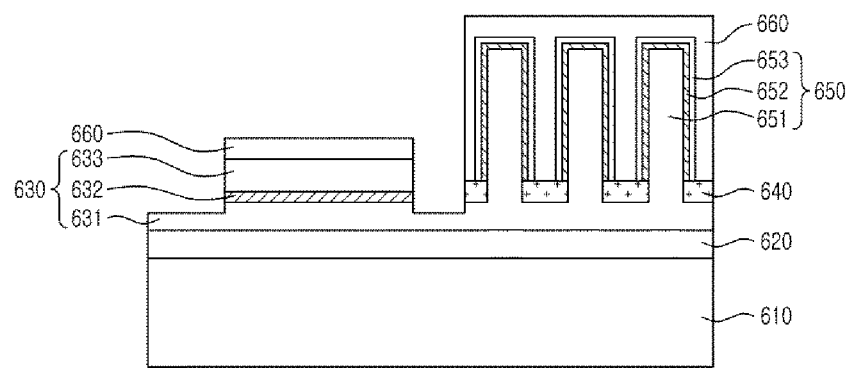

Thereafter, as illustrated in FIG. 12J, portions of the electrode layer 660, of the second conductivity-type semiconductor layer 633, and of the laminated active layer 632 between the thin film region A and the nanoscale light emitting region B of the semiconductor light emitting device 600 are etched, and portions of the electrode layer 660, of the second conductivity-type semiconductor layer 633, and of the laminated active layer 632 in the thin film region A are etched, to expose the first conductivity-type semiconductor layer 631.

Figure 12K:
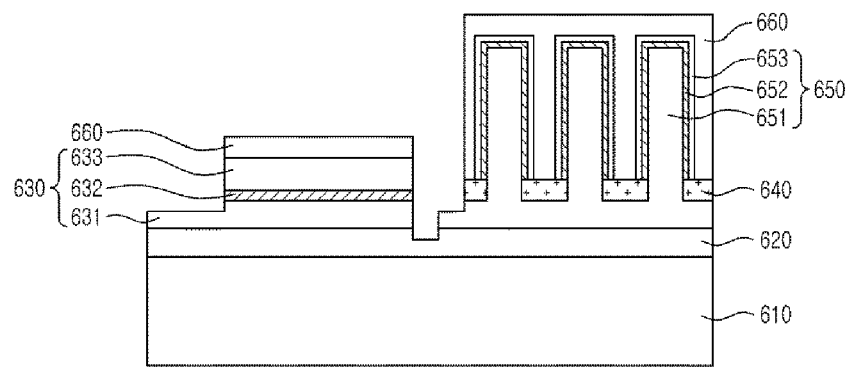

Thereafter, as illustrated in FIG. 12K, the portion between the thin film region A and the nanoscale light emitting region B of the semiconductor light emitting device 600 is further etched to expose the buffer layer 620. Accordingly, the thin film region A and the nanoscale light emitting region B are separated.

Figure 12L:
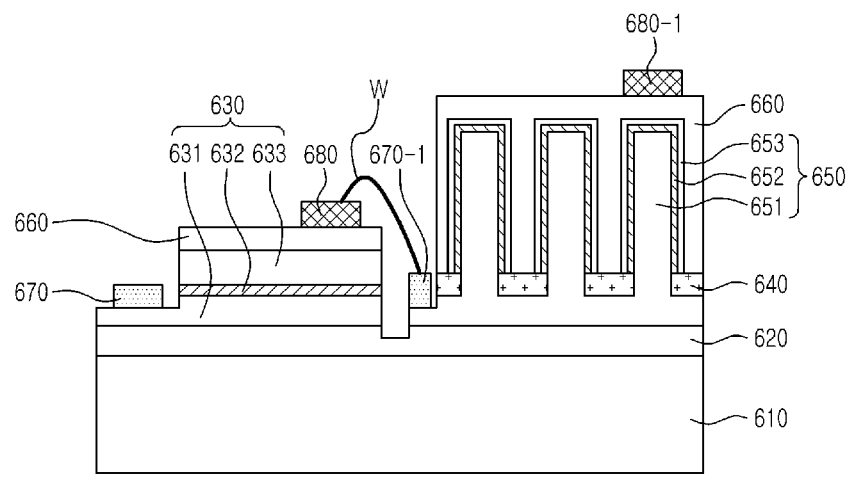

Subsequently, as illustrated in FIG. 12L, the first electrode 670 and the second electrode 680 are formed on the exposed first conductivity-type semiconductor layer 631 and the electrode layer 660 in the thin film region A of the semiconductor light emitting device 600, respectively. Additionally, a first nano-electrode 670-1 and a second nano-electrode 680-1 are formed on the exposed first conductivity-type nano-semiconductor layer 651 and the electrode layer 660 in the nanoscale light emitting region B of the semiconductor light emitting device 600, respectively. The second electrode 680 and the first nano-electrode 670-1 are connected by a wire W.

Alternatively, various other types of electrodes may be formed.

Figure 12M:
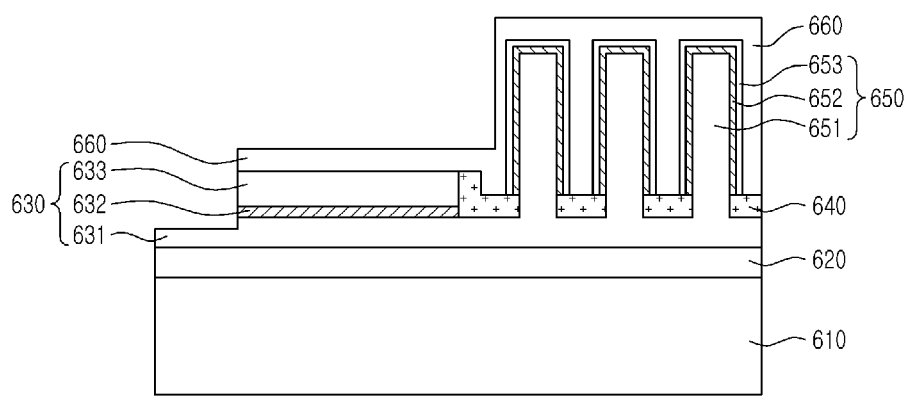

For example, after the electrode layer 660 is formed on the second conductivity-type semiconductor layer 633 and on the second conductivity-type nano-semiconductor layer 653 to cover the entirety thereof as illustrated in FIG. 12I, portions of the electrode layer 660, the second conductivity-type semiconductor layer 633, and the laminated active layer 632 may be etched to expose the first conductivity-type semiconductor layer 631 as illustrated in FIG. 12M.

Figure 12N:
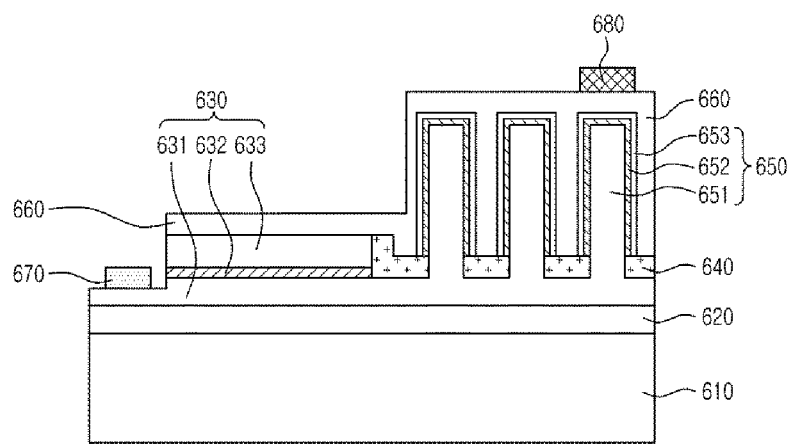

Subsequently, as illustrated in FIG. 12N, the first electrode 670 and the second electrode 680 are formed on the first conductivity-type semiconductor layer 631 and the electrode layer 660, respectively.

The semiconductor light emitting device according to the present embodiment is not limited to the foregoing embodiments and may be formed according to various other embodiments.

Figure 13:
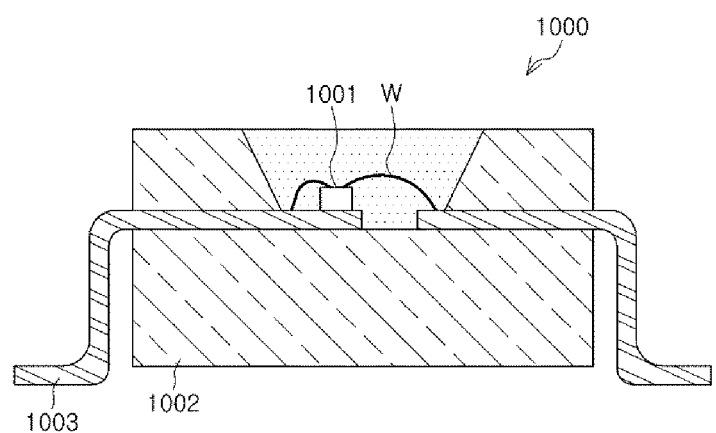
FIGS. 13 and 14 are views illustrating an example of a package including a semiconductor light emitting device according to an embodiment of the disclosure.
Figure 14:
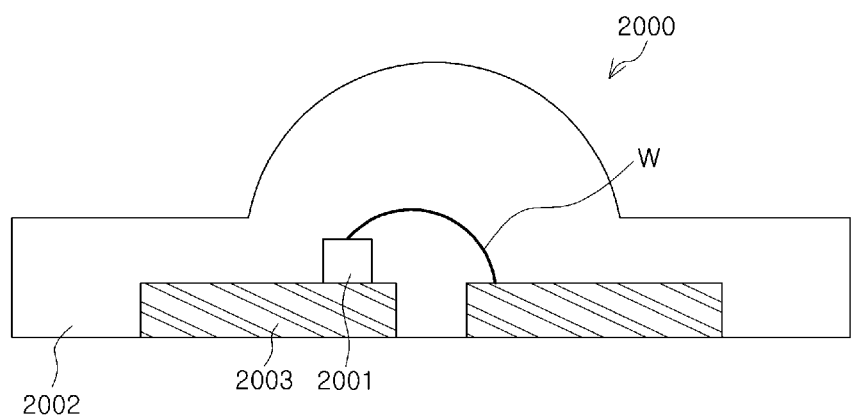

FIGS. 13 and 14 are cross-sectional views illustrating an example in which a semiconductor light emitting device according to an embodiment of the present disclosure is applied to a package. A package 1000 illustrated in FIG. 13 may include a semiconductor light emitting device 1001, a package body 1002 and a pair of lead frames 1003. The semiconductor light emitting device 1001 may be mounted on one of the lead frames 1003 and electrically connected to the other one of the lead frames 1003 through a wire W. Of course, the semiconductor light emitting device 1001 may be mounted on a region, e.g., the package body 1002, other than the lead frames 1003. As illustrated in FIG. 13, the package body 1002 may have a cup-like depression shaped to enhance light reflecting efficiency, and the reflective cup may be filled with a light-transmissive material to encapsulate the semiconductor light emitting device 1001, the wire W, and the like. As described above, the semiconductor light emitting device 1001 may have a structure having a nanoscale light emitting unit. Also, a single wire W may be used or may not be used according to an electrode type, a mounting method, and the like, of the semiconductor light emitting device 1001.

A package 2000 illustrated in FIG. 14 has a structure similar to that of the package 1000, in that the semiconductor light emitting device 2001 is disposed on a first lead frame of a pair of lead frames 2003 and electrically connected to a second lead frame of the pair of lead frames 2003 by a wire W. The package 2000 is different from the package 1000 in that a lower surface of the lead frame 2003 is exposed to be advantageously used for heat dissipation and that the configuration of the package 2000 is maintained by a light-transmissive body 2002 encapsulating the semiconductor light emitting device 2001, the wire W, and the lead frame 2003. The semiconductor light emitting device 2001 may have such a structure as described above, and in FIG. 14, the semiconductor light emitting device 2001 may have a configuration using a single wire W. Namely, in this configuration, the semiconductor light emitting device 2001 may include a nanoscale light emitting unit and a light emitting laminate, a substrate of the semiconductor light emitting device 2001 is formed as a conductive substrate, and an electrode pad may be formed on a semiconductor layer such that it is electrically connected to the semiconductor layer. However, the number of wires (W) may vary according to an electrode type, a mounting method, and the like, of the semiconductor light emitting device 2001.

Figure 15:
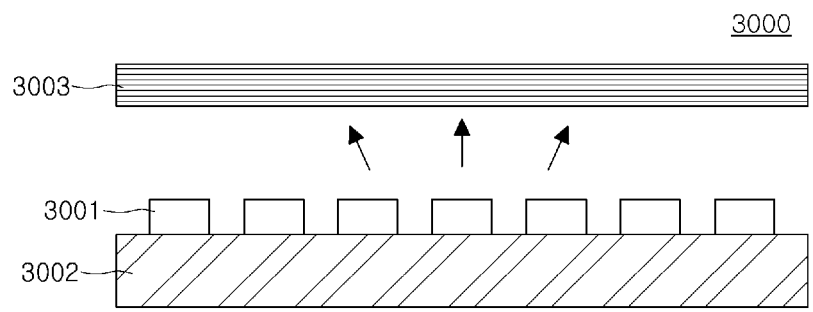
FIGS. 15 and 16 are views illustrating an example of a backlight unit including a semiconductor light emitting device according to an embodiment of the disclosure.
Figure 16:
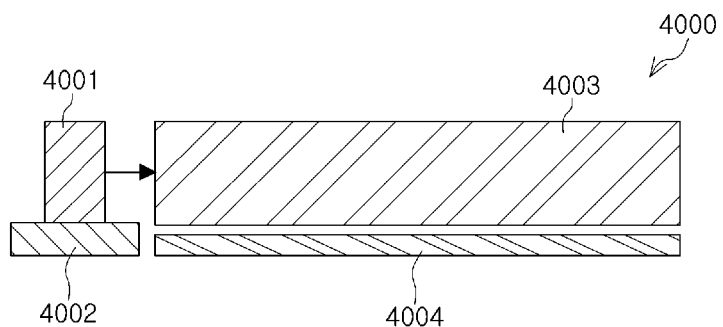

FIGS. 15 and 16 are cross-sectional views illustrating an example in which a semiconductor light emitting device according to an embodiment of the present disclosure is used in a backlight unit. Referring to FIG. 15, a backlight unit 3000 includes a plurality of light sources 3001 mounted on a substrate 3002 and one or more optical sheets 3003 disposed above the light sources 3001. As such, the light sources 3001 are disposed between the substrate 3002 and the optical sheets 3003. As the light source 3001, a light emitting device package having any of the foregoing structures or similar structures may be used, or alternatively, a semiconductor light emitting device may be directly mounted on the substrate 3002 (a so-called COB type) so as to be used. Unlike the backlight unit 3000 in FIG. 15 in which the light sources 3001 emit light toward an upper side where a liquid crystal display device is disposed, a backlight unit 4000 is illustrated in FIG. 16. The backlight unit 4000 is configured such that light sources 4001 mounted on a substrate 4002 emit light in a lateral direction, and the emitted light may be made incident to a light guide plate 4003 so as to be converted into a surface light source. Light, passing through the light guide plate 4003, is emitted upwardly, and in order to enhance light extraction efficiency, a reflective layer 4004 may be disposed on a lower surface of the light guide plate 4003.

Figure 17:
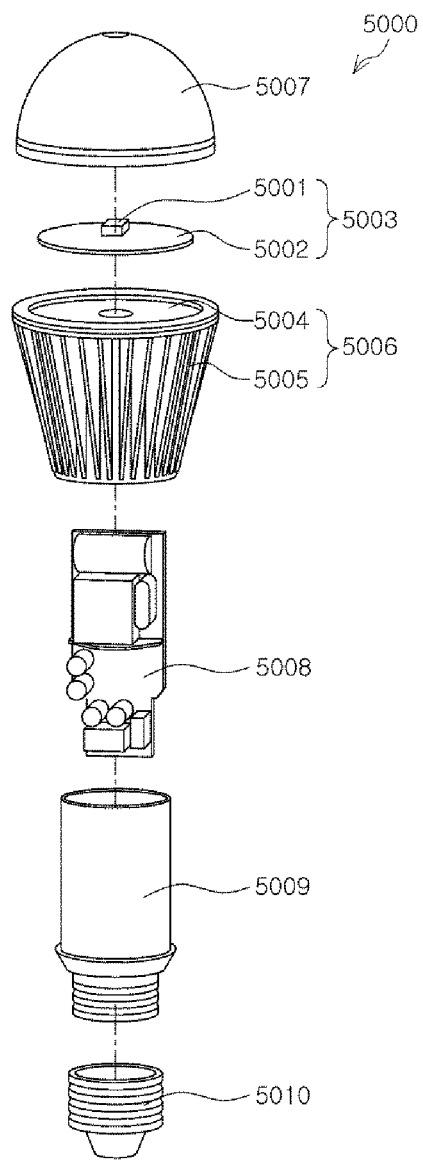
FIG. 17 is a view illustrating an example of a lighting device including a semiconductor light emitting device according to an embodiment of the disclosure.

FIG. 17 is a view illustrating an example in which a semiconductor light emitting device according to an embodiment of the present disclosure is applied to a lighting device. Referring to the exploded perspective view of FIG. 17, a lighting device 5000 is illustrated, for example, as a bulb-type lamp, and includes a light emitting module 5003, a driving unit 5008, and an external connection unit 5010. Also, the lighting device 5000 may further include external structures such as external and internal housings 5006 and 5009 and a cover unit 5007. The light emitting module 5003 may have a semiconductor light emitting device 5001 and a circuit board 5002 with the light emitting device 5001 mounted thereon. In the present embodiment, it is illustrated that a single semiconductor light emitting device 5001 is mounted on the circuit board 5002, but a plurality of semiconductor light emitting devices may more generally be mounted on the circuit board 5002 as necessary. Also, the semiconductor light emitting device 5001 may be fabricated in the form of a package and subsequently mounted on the circuit board 5002, rather than being directly mounted thereon.

Also, in the lighting device 5000, the light emitting module 5003 may include the external housing 5006 serving as a heat dissipation unit, and in this case, the external housing 5006 may include a heat dissipation plate 5004 disposed to be directly in contact with the light emitting module 5003 to enhance heat dissipation effect. Also, the lighting device 5000 may include the cover unit 5007 installed on the light emitting module 5003 and having a convex lens shape. The driving unit 5008 is installed in the internal housing 5009 and connected to the external connection unit 5010 having a socket structure to receive power from an external power source. Also, the driving unit 5008 may serve to convert power into an appropriate current source for driving a semiconductor light emitting device 5001 of the light emitting mode 5003, and provide the same. For example, the driving unit 5008 may be configured as an AC-DC converter, a rectifying circuit component, or the like.

Figure 18:
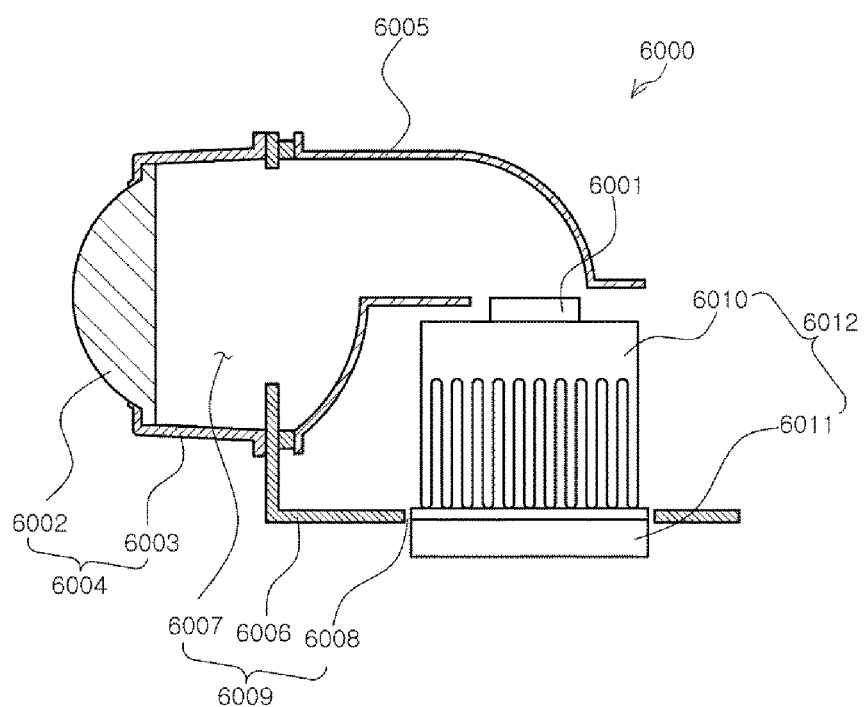
FIG. 18 is a view illustrating an example of a headlamp including a semiconductor light emitting device according to an embodiment of the disclosure.

FIG. 18 is a cross-sectional view illustrating an example in which a semiconductor light emitting device according to an embodiment of the present disclosure is used in a headlamp. Referring to FIG. 18, a headlamp 6000 used as a vehicle headlamp, or the like, may include a light source 6001, a reflective unit 6005, and a lens cover unit 6004. The lens cover unit 6004 may include a hollow guide 6003 and a lens 6002. Also, the headlamp 6000 may further include a heat dissipation unit 6012 dissipating heat generated by the light source 6001 outwardly. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a central hole 6008 formed on one surface thereof, in which the heat dissipation unit 6012 is coupled. Also, the housing 6009 may have a front hole 6007 formed on the other surface integrally connected to the one surface and bent in a right angle direction. The front hole 6007 may allow the reflective unit 6005 to be fixedly positioned above the light source 6001. Accordingly, a front side is opened by the reflective unit 6005, and the reflective unit 6005 is fixed to the housing 6009 such that the opened front side corresponds to the front hole 6007, and light reflected by the reflective unit 6005 may pass through the front hole 6007 so as to be output outwardly.

In the semiconductor light emitting device according to an embodiment of the present disclosure, the light emitting laminate and the nanoscale light emitting units emit light having different wavelengths, and thus, the semiconductor light emitting device can emit light having various wavelengths and thereby emit white light.

As set forth above, according to embodiments of the inventive concepts, the semiconductor light emitting device capable of providing light having multiple wavelengths without using phosphors and having enhanced light extraction efficiency can be provided.

While the present inventive concepts have been shown and described in connection with particular embodiments, modifications and variations can be made without departing from the spirit and scope of the inventive concepts as defined by the appended claims.

What is claimed is:

1. A semiconductor light emitting device comprising:
a substrate;
a base layer made of a semiconductor of a first conductivity type and disposed on the substrate;
a plurality of nanoscale light emitting units disposed in a first region of an upper surface of the base layer, each nanoscale light emitting unit including a first nano-semiconductor layer of a semiconductor of the first conductivity type and protruding from the upper surface of the base layer, a nano-active layer disposed on the first nano-semiconductor layer, and a second nano-semiconductor layer disposed on the nano-active layer and made of a semiconductor of a second conductivity type; and
a light emitting laminate disposed in a second region of the upper surface of the base layer different from the first region and having a laminated active layer.

2. The semiconductor light emitting device of claim 1, wherein the light emitting laminate includes a first semiconductor layer of the first conductivity type, the laminated active layer disposed on the first semiconductor layer, and a second semiconductor layer of the second conductivity type disposed on the laminated active layer such that surfaces of the first semiconductor layer, the laminated active layer, and the second semiconductor layer are substantially parallel to the upper surface of the substrate.

3. The semiconductor light emitting device of claim 1, wherein the nanoscale light emitting units have a nano-rod shape.

4. The semiconductor light emitting device of claim 1, wherein the nanoscale light emitting units include a plurality of semi-polar surfaces.

5. The semiconductor light emitting device of claim 1, wherein the nano-active layer emits light with a first wavelength band, and the laminated active layer emits light with a second wavelength band different from the first wavelength band.

6. The semiconductor light emitting device of claim 1, wherein the nanoscale light emitting units and the light emitting laminate emit light having different wavelengths.

7. The semiconductor light emitting device of claim 2, wherein the second nano-semiconductor layer and the second semiconductor layer are electrically insulated from each other.

8. The semiconductor light emitting device of claim 1, wherein at least one of the nanoscale light emitting units and the light emitting laminate is disposed in a plurality of separate regions.

9. The semiconductor light emitting device of claim 8, wherein a light emitting laminate or a nanoscale light emitting unit is disposed on the upper surface of the base layer between two of the plurality of separate regions.

* * * * *